(12) United States Patent
Huang et al.

(10) Patent No.: US 11,244,970 B2
(45) Date of Patent: Feb. 8, 2022

(54) THIN FILM TRANSISTOR, ARRAY SUBSTRATE, DISPLAY APPARATUS, AND METHOD OF FABRICATING THIN FILM TRANSISTOR

(71) Applicants: BOE TECHNOLOGY GROUP CO., LTD., Beijing (CN); Chongqing BOE Optoelectronics Technology Co., Ltd., Chongqing (CN)

(72) Inventors: Zhonghao Huang, Beijing (CN); Yongliang Zhao, Beijing (CN); Jun Wang, Beijing (CN); Yutong Yang, Beijing (CN); Jianfei Shi, Beijing (CN); Baosheng He, Beijing (CN); Xu Wu, Beijing (CN)

(73) Assignees: BOE TECHNOLOGY GROUP CO., LTD., Beijing (CN); Chongqing BOE Optoelectronics Technology Co., Ltd., Chongqing (CN)

( * ) Notice: Subject to any disclaimer, the term of this patent is extended or adjusted under 35 U.S.C. 154(b) by 831 days.

(21) Appl. No.: 15/768,297

(22) PCT Filed: Aug. 24, 2017

(86) PCT No.: PCT/CN2017/098827
§ 371 (c)(1),
(2) Date: Apr. 13, 2018

(87) PCT Pub. No.: WO2018/205450
PCT Pub. Date: Nov. 15, 2018

(65) Prior Publication Data
US 2020/0258919 A1   Aug. 13, 2020

(30) Foreign Application Priority Data
May 12, 2017   (CN) .......................... 201710334008.5

(51) Int. Cl.
*H01L 29/04*   (2006.01)
*H01L 27/12*   (2006.01)
(Continued)

(52) U.S. Cl.
CPC ...... *H01L 27/1251* (2013.01); *H01L 21/0274* (2013.01); *H01L 21/441* (2013.01);
(Continued)

(58) Field of Classification Search
CPC ............... H01L 27/1251; H01L 27/124; H01L 27/1248; H01L 27/1288; H01L 29/66757;
(Continued)

(56) References Cited

U.S. PATENT DOCUMENTS 6,664,569 B2 * 12/2003 Moon .................. G02F 1/1368
257/72
7,777,220 B2 * 8/2010 Choi ..................... H01L 27/283
257/40
(Continued)

FOREIGN PATENT DOCUMENTS

CN   103219391 A   7/2013
CN   103489921 A   1/2014
(Continued)

OTHER PUBLICATIONS

First Office Action in the Chinese Patent Application No. 201710334008. 5, dated Mar. 25, 2020; English translation attached.
(Continued)

*Primary Examiner* — Shouxiang Hu
(74) *Attorney, Agent, or Firm* — Intellectual Valley Law, P.C.

(57) ABSTRACT

The present application discloses a thin film transistor. The thin film transistor includes a base substrate; an active layer; an etch stop layer on a side of the active layer distal to the base substrate; and a source electrode and a drain electrode
(Continued)

on a side of the etch stop layer distal to the active layer. The active layer includes a channel region, a source electrode contact region, and a drain electrode contact region. An orthographic projection of the etch stop layer on the base substrate surrounds an orthographic projection of the drain electrode contact region on the base substrate. An orthographic projection of the source electrode contact region on the base substrate at least partially peripherally surrounding the orthographic projection of the etch stop layer on the base substrate.

17 Claims, 20 Drawing Sheets

(51) Int. Cl.
    *H01L 29/66* (2006.01)
    *H01L 29/786* (2006.01)
    *H01L 21/768* (2006.01)
    *H01L 21/027* (2006.01)
    *H01L 21/441* (2006.01)
    *H01L 21/84* (2006.01)

(52) U.S. Cl.
    CPC ...... *H01L 21/76831* (2013.01); *H01L 27/124* (2013.01); *H01L 27/1214* (2013.01); *H01L 27/1248* (2013.01); *H01L 27/1288* (2013.01); *H01L 29/66757* (2013.01); *H01L 29/66765* (2013.01); *H01L 29/78666* (2013.01); *H01L 29/78669* (2013.01); *H01L 29/78678* (2013.01)

(58) Field of Classification Search
    CPC ......... H01L 29/66765; H01L 29/78666; H01L 29/78669; H01L 29/78696; H01L 29/42384; H01L 27/1225; H01L 29/41733; H01L 29/417; H01L 29/7869; H01L 29/41775; H01L 29/66742; H01L 29/78606; H01L 27/1214; H01L 29/78678; H01L 27/1259; H01L 29/78609; H01L 21/0274; H01L 29/786; H01L 27/1244; H01L 21/441; H01L 21/76831

See application file for complete search history.

(56) References Cited

U.S. PATENT DOCUMENTS

| | | | |
|---|---|---|---|
| 7,825,412 B2* | 11/2010 | Watanabe | H01L 29/78609 257/59 |
| 8,963,153 B2* | 2/2015 | Choo | H01L 29/41733 257/59 |
| 9,634,036 B1 | 4/2017 | Yao | |
| 2005/0023561 A1* | 2/2005 | Choi | G02F 1/136286 257/200 |
| 2006/0043447 A1 | 3/2006 | Ishii et al. | |
| 2006/0258034 A1 | 11/2006 | Sohn | |
| 2013/0207101 A1 | 8/2013 | Yamazaki et al. | |
| 2015/0034942 A1 | 2/2015 | Kim et al. | |
| 2015/0214373 A1 | 7/2015 | Zhang et al. | |
| 2015/0311236 A1 | 10/2015 | Choi | |
| 2015/0333181 A1 | 11/2015 | Zeng et al. | |
| 2016/0027807 A1 | 1/2016 | Zhang | |
| 2016/0027812 A1 | 1/2016 | Kim et al. | |
| 2016/0027919 A1 | 1/2016 | Chung et al. | |

FOREIGN PATENT DOCUMENTS

| | | |
|---|---|---|
| CN | 103715270 A | 4/2014 |
| CN | 103730475 A | 4/2014 |
| CN | 103762218 A | 4/2014 |
| CN | 104134671 A | 11/2014 |
| CN | 105789320 A | 7/2016 |
| CN | 106024908 A | 10/2016 |

OTHER PUBLICATIONS

The Extended European Search Report in the European Patent Application No. 17861194.3, dated Jul. 12, 2019.
International Search Report & Written Opinion dated Jan. 26, 2018, regarding PCT/CN2017/098827.

* cited by examiner

*Related Art*

*Related Art*

A-A

A-A

A-A

THIN FILM TRANSISTOR, ARRAY SUBSTRATE, DISPLAY APPARATUS, AND METHOD OF FABRICATING THIN FILM TRANSISTOR

CROSS-REFERENCE TO RELATED APPLICATION

This application is a national stage application under 35 U.S.C. § 371 of International Application No. PCT/CN2017/098827, filed Aug. 24, 2017, which claims priority to Chinese Patent Application No. 201710334008.5, filed May 12, 2017, the contents of which are incorporated by reference in the entirety.

TECHNICAL FIELD

The present invention relates to display technology, more particularly, to a thin film transistor, an array substrate, a display apparatus, and a method of fabricating a thin film transistor.

BACKGROUND

Metal oxide or metal oxynitride thin film transistors have many advantages such as a higher carrier density and higher mobility. Accordingly, the metal oxide or metal oxynitride thin film transistors can be made smaller, and the display panel made of such thin film transistors can achieve a higher resolution and a better display effect. Moreover, the metal oxide or metal oxynitride thin film transistors have the advantages of lower manufacturing costs, higher transmittance, and higher band gap. The metal oxide or metal oxynitride thin film transistors have found a wide range of applications in display field.

SUMMARY

In one aspect, the present invention provides a thin film transistor comprising a base substrate; an active layer; an etch stop layer on a side of the active layer distal to the base substrate; and a source electrode and a drain electrode on a side of the etch stop layer distal to the active layer; wherein the active layer comprises a channel region, a source electrode contact region, and a drain electrode contact region; an orthographic projection of the etch stop layer on the base substrate surrounds an orthographic projection of the drain electrode contact region on the base substrate; and an orthographic projection of the source electrode contact region on the base substrate at least partially peripherally surrounding the orthographic projection of the etch stop layer on the base substrate.

Optionally, the thin film transistor comprises a first via extending through the etch stop layer, the drain electrode electrically connected to the drain electrode contact region through the first via; wherein an orthographic projection of the drain electrode on the base substrate completely covers an orthographic projection of the first via and an orthographic projection of the drain electrode contact region on the base substrate.

Optionally, the orthographic projection of the etch stop layer on the base substrate completely surrounds an orthographic projection of the drain electrode on the base substrate, and partially overlaps with the orthographic projection of the drain electrode on the base substrate resulting in an overlapping area; and the overlapping area completely surrounds the orthographic projection of the first via and the orthographic projection of the drain electrode contact region on the base substrate.

Optionally, the thin film transistor further comprises a gate electrode and a second via extending through the gate electrode; wherein an orthographic projection of the second via at least partially overlaps with the orthographic projection of the first via.

Optionally, the orthographic projection of the second via substantially overlaps with the orthographic projection of the first via.

Optionally, the thin film transistor is a bottom-gate type thin film transistor; the thin film transistor further comprises a gate insulating layer on a side of the gate electrode distal to base substrate and proximal to the active layer; and the gate insulating layer extends through the second via.

Optionally, the thin film transistor is a top-gate type thin film transistor; and the thin film transistor further comprises a gate insulating layer on a side of the gate electrode proximal to the active layer, the source electrode, and the drain electrode.

Optionally, the source electrode contact region has a substantially U shape; the source electrode comprises a first portion, a second portion, and a third portion connecting the first portion and the second portion; and the first portion, the second portion, and the third portion form a structure having a substantially U shape.

Optionally, the source electrode contact region has a substantially L shape; the source electrode comprises a first portion and a second portion connected to the first portion; and the first portion and the second portion form a structure having a substantially L shape.

In another aspect, the present invention provides an array substrate comprising a thin film transistor described herein or fabricated by a method described herein.

Optionally, the thin film transistor is a bottom-gate type thin film transistor; the array substrate further comprises a passivation layer on a side of the source electrode and the drain electrode distal to the active layer; a third via extending through the passivation layer; and a pixel electrode layer on a side of the passivation layer distal to the active layer; wherein the pixel electrode layer extends through the third via and is electrically connected to the drain electrode through the third via; and an orthographic projection of the pixel electrode layer on the base substrate is substantially non-overlapping with an orthographic projection of the source electrode on the base substrate.

Optionally, the thin film transistor is a top-gate type thin film transistor; the thin film transistor further comprises a gate electrode and a second via extending through the gate electrode; and a gate insulating layer on a side of the gate electrode proximal to the active layer, the source electrode, and the drain electrode; the array substrate further comprises a passivation layer on a side of the gate electrode layer distal to the gate insulating layer, the passivation layer extending through the second via; and an orthographic projection of the second via at least partially overlaps with the orthographic projection of the first via.

Optionally, the array substrate further comprises a third via extending through the passivation layer and the gate insulating layer, and a pixel electrode layer on a side of the passivation layer distal to the active layer; wherein the pixel electrode layer extends through the third via and is electrically connected to the drain electrode through the third via; the orthographic projection of the second via surrounds an orthographic projection of the third via; and an orthographic projection of the pixel electrode layer on the base substrate is substantially non-overlapping with an orthographic projection of the source electrode on the base substrate.

Optionally, the army substrate further comprises a plurality of gate lines and a plurality of data lines; wherein the source electrode comprising a first portion, a second portion, and a third portion connecting the first portion and the second portion; the first portion, the second portion, and the third portion form a substantially U-shape structure; the third portion extends along a direction substantially parallel to one of the plurality of gate lines; and the first portion and the second portion extend along a direction substantially parallel to one of the plurality of data lines.

Optionally, the array substrate further comprises a plurality of gate lines and a plurality of data lines; wherein the source electrode comprising a first portion and a second portion connected to the second portion; the first portion and the second portion form a substantially L-shape structure; the first portion extends along a direction substantially parallel to one of the plurality of data lines; and the second portion extends along a direction substantially parallel to one of the plurality of gate lines.

In another aspect, the present invention provides a display apparatus comprising a thin film transistor described herein or fabricated by a method described herein.

In another aspect, the present invention provides a method of fabricating a thin film transistor, comprising forming an active layer on a base substrate; forming an etch stop layer on a side of the active layer distal to the base substrate; and forming a source electrode and a drain electrode on a side of the etch stop layer distal to the active layer; wherein the active layer is formed to comprise a channel region, a source electrode contact region, and a drain electrode contact region; the etch stop layer is formed so that an orthographic projection of the etch stop layer on the base substrate surrounds an orthographic projection of the drain electrode contact region on the base substrate; and an orthographic projection of the source electrode contact region on the base substrate at least partially peripherally surrounding the orthographic projection of the etch stop layer on the base substrate.

Optionally, forming the active layer comprises forming a semiconductor material layer, and subsequent to forming the source electrode, the drain electrode, and the etch stop layer, patterning the semiconductor material layer using the source electrode, the drain electrode, and the etch stop layer as a mask plate, thereby forming the active layer.

Optionally, forming a first via extending through the etch stop layer; wherein the drain electrode is formed to be electrically connected to the drain electrode contact region through the first via; and an orthographic projection of the drain electrode on the base substrate completely covers an orthographic projection of the first via and an orthographic projection of the drain electrode contact region on the base substrate.

Optionally, the etch stop layer and the drain electrode are formed so that the orthographic projection of the etch stop layer on the base substrate completely surrounds an orthographic projection of the drain electrode on the base substrate, and partially overlaps with the orthographic projection of the drain electrode on the base substrate resulting in an overlapping area; and the overlapping area completely surrounds the orthographic projection of the first via and the orthographic projection of the drain electrode contact region on the base substrate.

Optionally, the method further comprises forming a gate electrode and forming a second via extending through the gate electrode; wherein the first via and the second via are formed so that an orthographic projection of the second via at least partially overlaps with the orthographic projection of the first via.

Optionally, the first via and the second via are formed so that the orthographic projection of the second via substantially overlaps with the orthographic projection of the first via.

In another aspect, the present invention provides a method of fabricating an array substrate, comprising forming a thin film transistor according to the method described herein; forming a passivation layer on a side of the source electrode and the drain electrode distal to the active layer; forming a third via extending through the passivation layer; and forming a pixel electrode layer on a side of the passivation layer distal to the active layer; wherein the pixel electrode layer is formed to extend through the third via and is electrically connected to the drain electrode through the third via; and the pixel electrode layer is formed so that an orthographic projection of the pixel electrode layer on the base substrate is substantially non-overlapping with an orthographic projection of the source electrode on the base substrate.

In another aspect, the present invention provides a method of fabricating an array substrate, comprising forming a thin film transistor according to the method described herein; wherein forming the thin film transistor further comprises forming a gate insulating layer on a side of the source electrode, the drain electrode and the etch stop layer distal to the active layer, and forming a gate electrode on a side of the gate insulating layer distal to the base substrate; wherein the method further comprises forming a passivation layer on a side of the gate electrode distal to the gate insulating layer, forming a third via extending through the passivation layer and the gate insulating layer; and forming a pixel electrode layer on a side of the passivation layer distal to the gate electrode; wherein the pixel electrode layer is formed to extend through the third via and is electrically connected to the drain electrode through the third via; and the pixel electrode layer is formed so that an orthographic projection of the pixel electrode layer on the base substrate is substantially non-overlapping with an orthographic projection of the source electrode on the base substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1A:
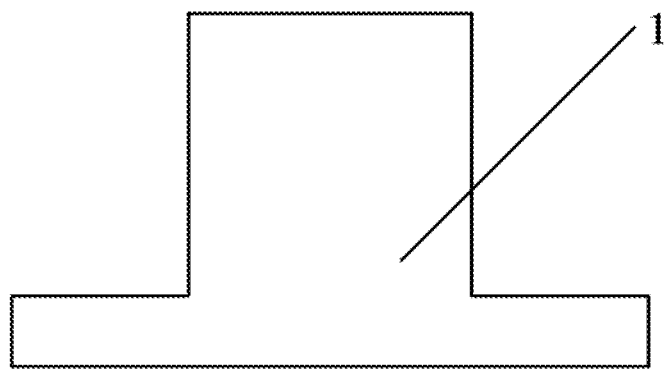
FIGS. 1A to 1E illustrate a method of fabricating a conventional thin film transistor.
Figure 1B:
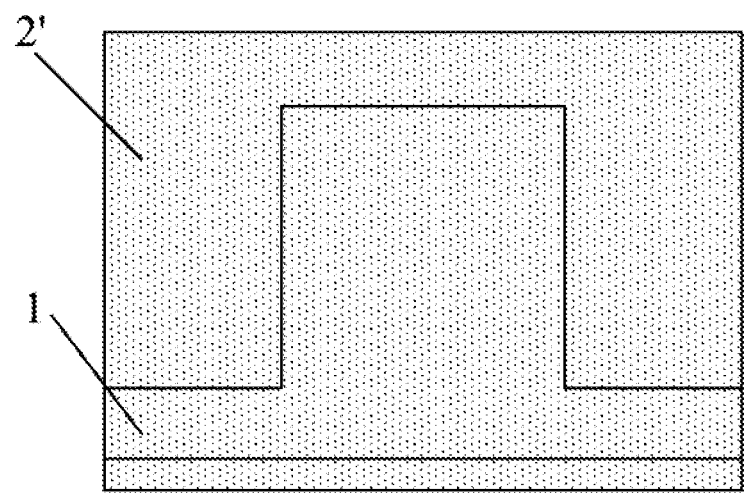
Figure 1C:
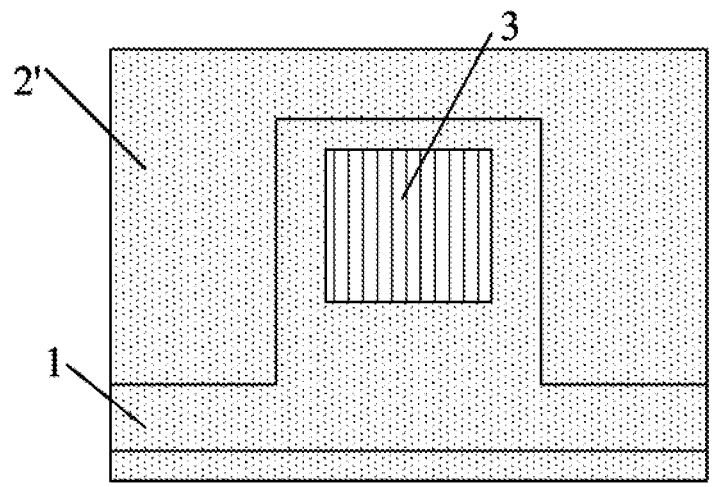
Figure 1D:
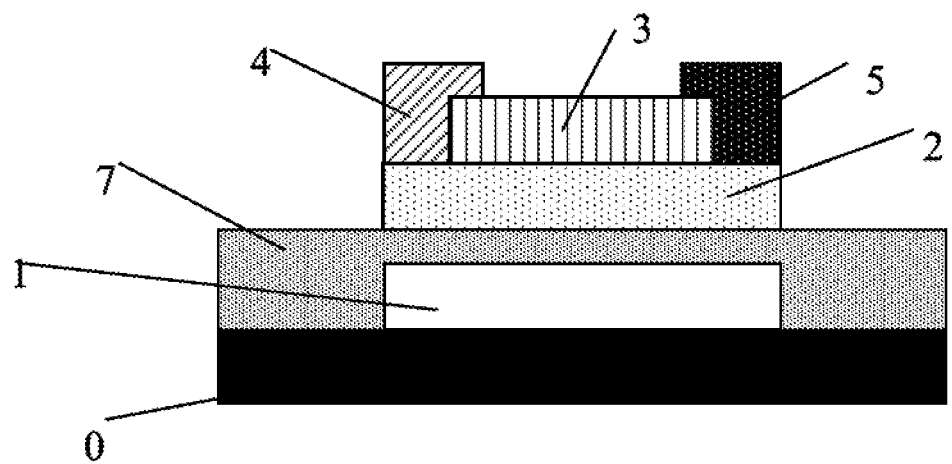
Figure 1E:
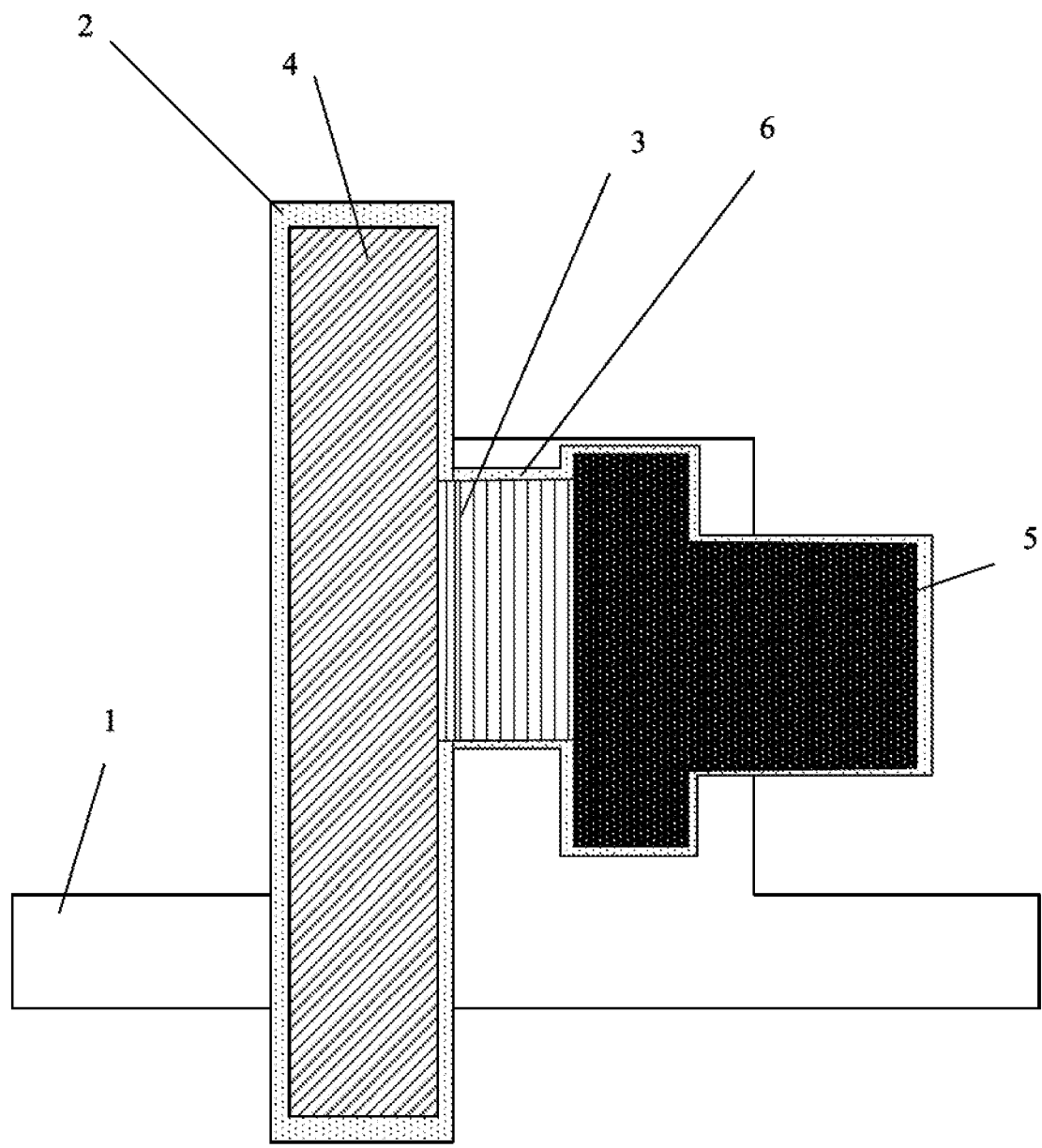

Metal oxide thin film transistors may be fabricated to have a side-wing contact (SWC) structure to simplify the fabrication process. FIGS. 1A to 1E illustrate a method of fabricating a conventional thin film transistor. Referring to FIG. 1A and FIG. 1D, a gate electrode 1 is formed on a base substrate 0, and a gate insulating layer 7 is then formed on a side of the gate electrode 1 distal to the base substrate 0. Referring to FIG. 1B, a semiconductor material layer 2' (e.g., an indium gallium zinc oxide layer) is formed on a side of the gate insulating layer 7 distal to the base substrate 0. Referring to FIG. 1C and FIG. 1D, an etch stop layer 3 is formed on a side of the semiconductor material layer 2'. Referring to FIG. 1D and FIG. 1E, a source electrode 4 and a drain electrode 5 are formed on a side of the etch stop layer 3 distal to the semiconductor material layer 2'. The semiconductor material layer 2' is then patterned using the etch stop layer 3, the source electrode 4, and the drain electrode 5 as a mask plate, thereby forming the active layer 2.

Subsequent to the step of patterning of the semiconductor material layer 2' using the etch stop layer 3, the source electrode 4, and the drain electrode 5 as the mask plate, the active layer 2 formed in the patterning process includes an exposed portion 6 along the edge of the etch stop layer 3, as depicted in FIG. 1E. In the subsequent fabricating steps, the exposed portion 6 along the edge of the etch stop layer 3 is often damaged by, e.g., plasma and etching solutions using in the fabricating steps, resulting in oxygen vacancies in the exposed portion 6. As a result, the carrier density and mobility rate in the exposed portion are different from those of the other portions of the active layer 2. A secondary channel region having a relatively low threshold voltage is formed between the source electrode 4 and the drain electrode 5 along the exposed portion 6. The secondary channel region has different semiconductor characteristics from those of the channel region of the active layer 2, leading to hump effect which deteriorate the properties of the thin film transistor. Moreover, the secondary channel region is subject to various damages, it has lower stability, often resulting in defects in the products.

Accordingly, the present disclosure provides, inter alia, a thin film transistor, an array substrate, a display apparatus, and a method of fabricating a thin film transistor that substantially obviate one or more of the problems due to limitations and disadvantages of the related art. In one aspect, the present disclosure provides a novel thin film transistor. The thin film transistor in some embodiments includes a base substrate; a gate electrode; an active layer, a gate insulating layer between the gate electrode and the active layer, an etch stop layer on a side of the active layer distal to the base substrate; and a source electrode and a drain electrode on a side of the etch stop layer distal to the active layer. The active layer includes a channel region, a source electrode contact region, and a drain electrode contact region. Optionally, an orthographic projection of the etch stop layer on the base substrate surrounds an orthographic projection of the drain electrode contact region on the base substrate. Optionally, an orthographic projection of the source electrode contact region at least partially peripherally surrounding the orthographic projection of the etch stop layer.

In some embodiments, the active layer is made of a material comprising $M1O_aN_b$, wherein M1 is a single metal or a combination of metals, a>0, and b≥0, e.g., the active layer is made of a metal oxide material or a metal oxynitride material. Examples of appropriate metal oxide active layer materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material comprising $M1O_aN_b$ doped with one or more metal element. Optionally, the active layer is made of a material comprising $M1O_aN_b$ doped with one or more non-metal element. Optionally, the active layer is made of a material comprising $MIO_aN_b$ doped with one or more metal element and one or more non-metal element.

As used herein, the term "etch stop layer" refers to a layer that prevents etching of an underlying active layer. Optionally, the etch stop layer is substantially resistant to an etchant for etching the source electrode and the drain electrode. Optionally, the etch stop layer is substantially resistant to a wet etchant for etching the source electrode and the drain electrode. Optionally, the etch stop layer is made of a silicon-containing compound. Examples of silicon-containing compounds for making the etch stop layer include, but are not limited to, silicon oxide, silicon nitride, silicon oxynitride, silicon carbide, silicon oxycarbide, silicon, and silicon germanium.

In some embodiments, the thin film transistor is a bottom-gate type thin film transistor. For examples, the thin film transistor may further include a gate electrode on a side of the active layer proximal to the base substrate, and a gate insulating layer between the active layer and the gate electrode.

Figure 2A:
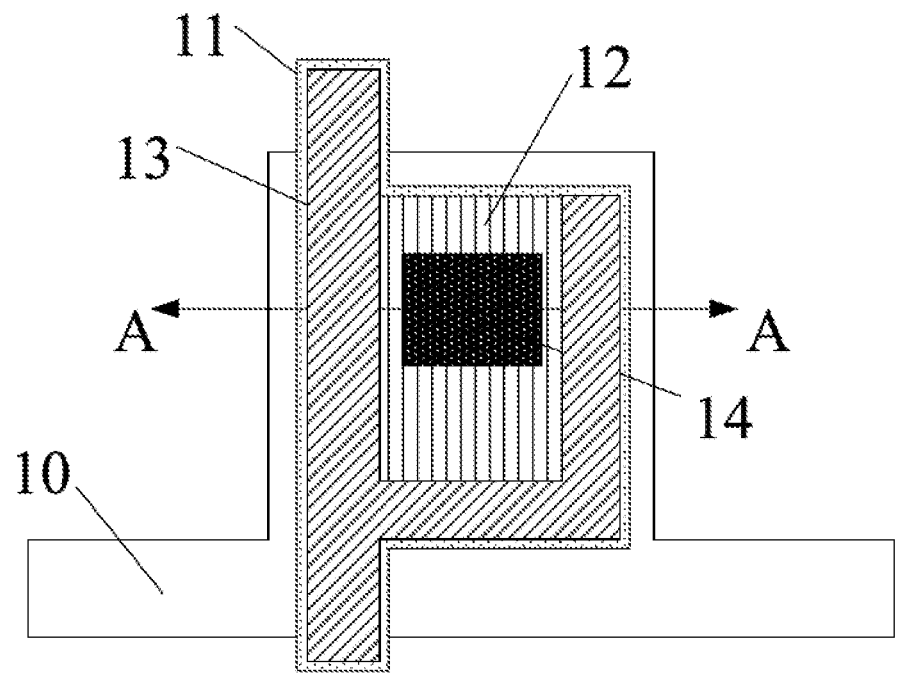
FIG. 2A is a schematic diagram illustrating the structure of a thin film transistor in some embodiments according to the present disclosure.
Figure 2B:
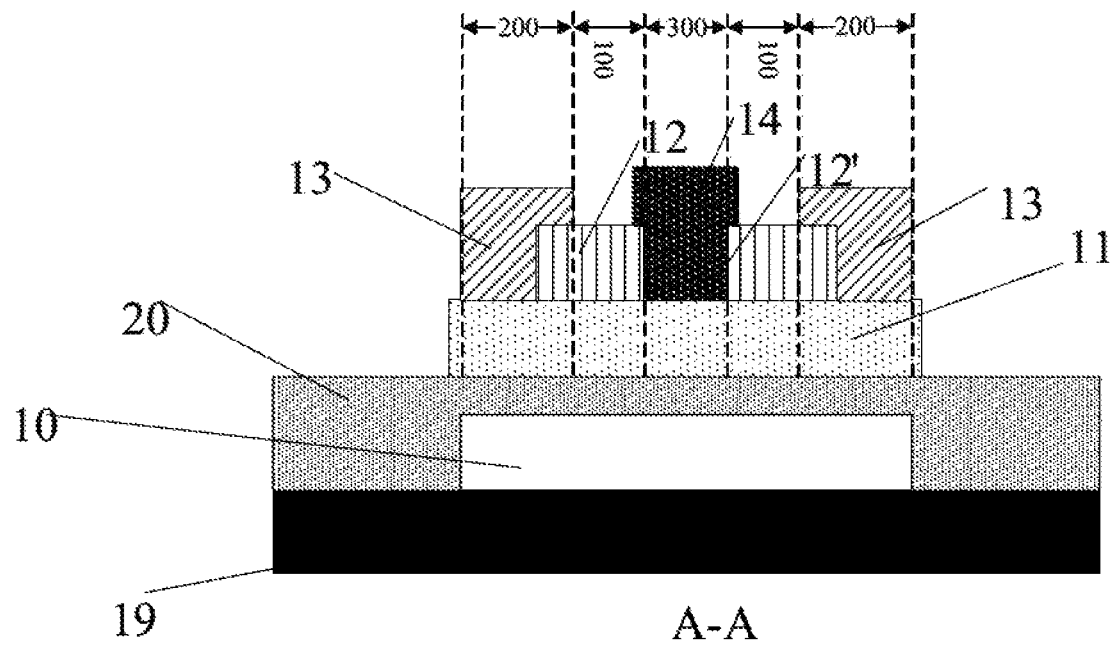
FIG. 2B is a cross-sectional view along the line A-A in FIG. 2A.

FIG. 2A is a schematic diagram illustrating the structure of a thin film transistor in some embodiments according to the present disclosure. FIG. 2B is a cross-sectional view along the line A-A in FIG. 2A. Referring to FIGS. 2A and 2B, the thin film transistor in some embodiments includes a base substrate 19; a gate electrode 10; a gate insulating layer 20 on a side of the gate electrode 10 distal to the base substrate 19; an active layer 11 on a side of the gate insulating layer 20 distal to the gate electrode 10; an etch stop layer 12 on a side of the active layer 11 distal to the gate insulating layer 20; and a source electrode 13 and a drain electrode 14 on a side of the etch stop layer 12 distal to the active layer 11. The active layer 11 includes a channel region 100, a source electrode contact region 200, and a drain electrode contact region 300.

Figure 2C:
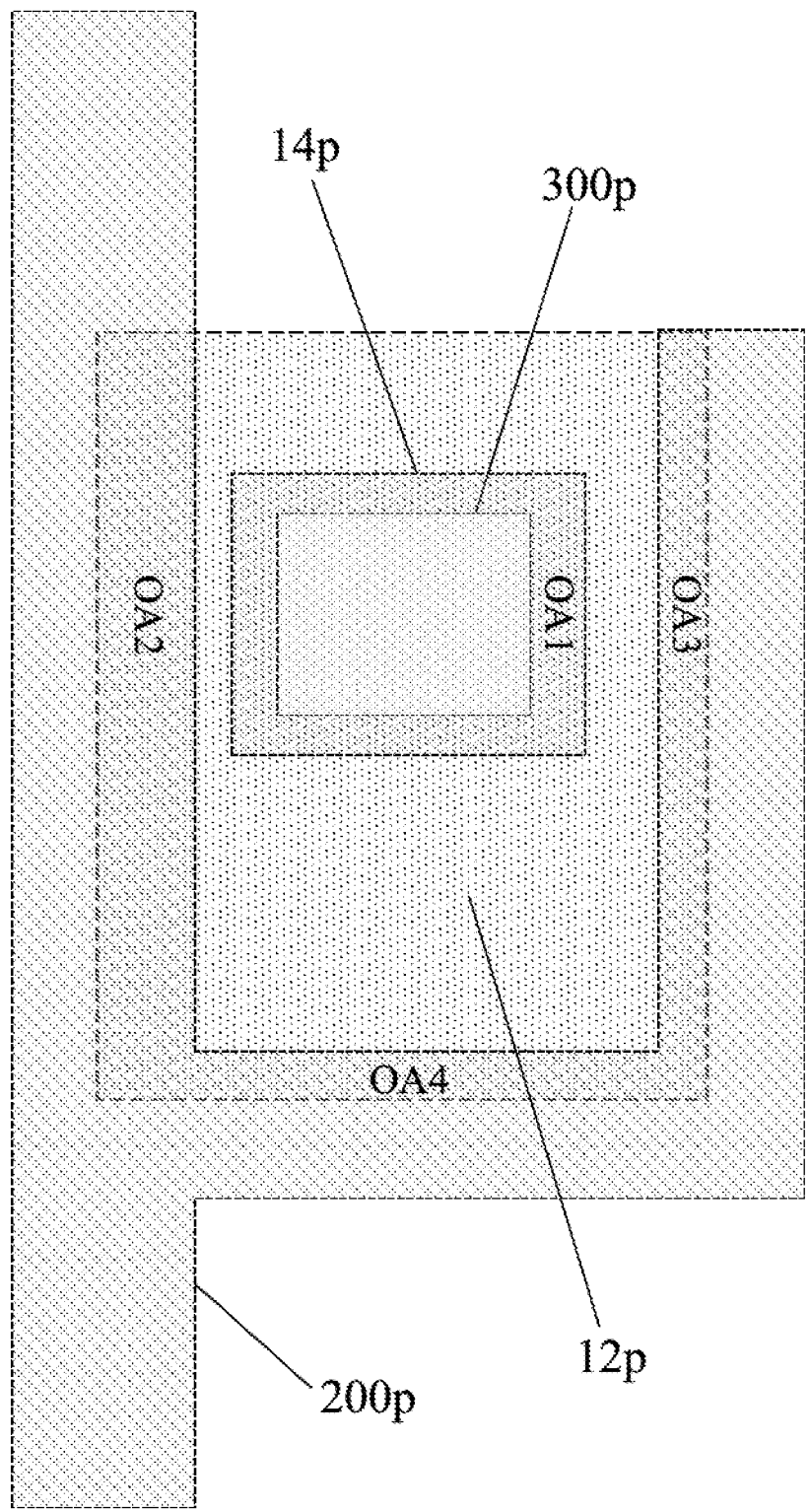
FIG. 2C illustrates projections of various components of the thin film transistor in some embodiments according to the present disclosure.

FIG. 2C illustrates projections of various components of the thin film transistor in some embodiments according to the present disclosure. Referring to FIG. 2C, an orthographic projection 12*p* of the etch stop layer 12 on the base substrate 19 surrounds an orthographic projection 300*p* of the drain electrode contact region 300 on the base substrate 19. An orthographic projection 200*p* of the source electrode contact region 200 on the base substrate 19 at least partially peripherally surrounding the orthographic projection 12*p* of the etch stop layer 12 on the base substrate 19. Optionally, the orthographic projection 200*p* of the source electrode contact region 200 on the base substrate 19 is substantially the same as an orthographic projection of the source electrode 13 on the base substrate 19. Optionally, the orthographic projection of the source electrode 13 on the base substrate 19 at least partially peripherally surrounding the orthographic projection 12*p* of the etch stop layer 12 on the base substrate 19. For example, at least a part of the orthographic projection 200*p* of the source electrode contact region 200 on the base substrate 19 surrounds the orthographic projection 12*p* of the etch stop layer 12 on the base substrate 19 at the external boundary or perimeter of the orthographic projection 12*p* of the etch stop layer 12 on the base substrate 19. Referring to FIG. 2C, in some embodiments, the orthographic projection 200*p* of the source electrode contact region 200 on the base substrate 19 partially overlaps the orthographic projection 12*p* of the etch stop layer 12 on the base substrate 19, resulting in a second overlapping area OA2, a third overlapping area OA3, and a fourth overlapping area OA4. Optionally, the non-overlapping portion of the orthographic projection 200*p* of the source electrode contact region 200 on the base substrate 19 surrounds the orthographic projection 12*p* of the etch stop layer 12 on the base substrate 19 at the external boundary or perimeter of the orthographic projection 12*p* of the etch stop layer 12 on the base substrate 19.

Figure 2D:
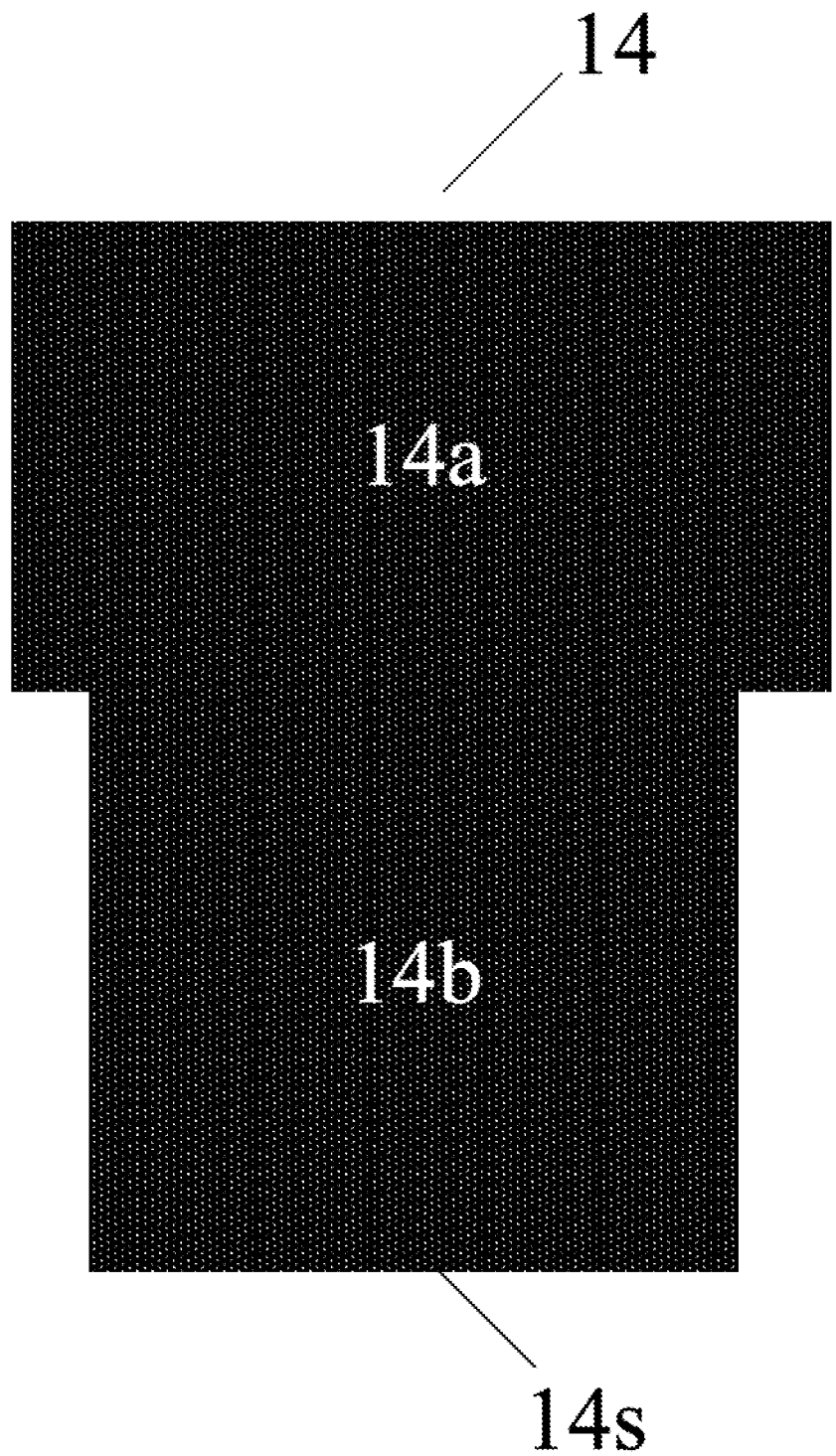
FIG. 2D is a schematic diagram illustrating the structure of a drain electrode in some embodiments according to the present disclosure.

In some embodiments, and as shown in FIG. 2B, the thin film transistor includes a first via 12' extending through the etch stop layer 12. The drain electrode 14 is electrically connected to the drain electrode contact region 300 of the active layer 11 through the first via 12'. Referring to FIG. 2C, an orthographic projection 14*p* of the drain electrode 14 on the base substrate 19 completely covers an orthographic projection of the first via and an orthographic projection of the drain electrode contact region on the base substrate. FIG. 2D is a schematic diagram illustrating the structure of a drain electrode in some embodiments according to the present disclosure. Referring to FIG. 2D, the drain electrode 14 in some embodiments includes an upper portion 14*a* and a lower portion 14*b*. The lower portion 14*b* includes a bottom surface 14*s* in contact with the drain electrode contact region 300. Optionally, the upper portion 14*a* has an area larger than that of the lower portion 14*b*. Optionally, the orthographic projection 14*p* of the drain electrode 14 on the base substrate 19 is an orthographic projection of the upper portion 14*a* of the drain electrode 14 on the base substrate 19. Optionally, an orthographic projection of the bottom surface 14*s* of the lower portion 14*b* substantially overlaps with the orthographic projection 300*p* of the drain electrode contact region 300 on the base substrate 19.

Referring to FIG. 2C, in some embodiments, the orthographic projection 12*p* of the etch stop layer 12 on the base substrate 19 completely surrounds the orthographic projection 14*p* of the drain electrode 14 on the base substrate 19, and partially overlaps with the orthographic projection 14*p* of the drain electrode 14 on the base substrate 19, resulting in an overlapping area OA1. Optionally, the overlapping area OA1 completely surrounds the orthographic projection 300*p* of the drain electrode contact region 300 on the base substrate 19. Optionally, the overlapping area OA1 completely surrounds an orthographic projection of the first via 12' on the base substrate 19. Optionally, the orthographic projection of the first via 12' on the base substrate 19 substantially overlaps with the orthographic projection 300*p* of the drain electrode contact region 300 on the base substrate 19.

In the present thin film transistor, the orthographic projection 12*p* of the etch stop layer 12 on the base substrate 19 surrounds the orthographic projection 300*p* of the drain electrode contact region 300 on the base substrate 19, the orthographic projection 200*p* of the source electrode contact region 200 on the base substrate 19 at least partially peripherally surrounding the orthographic projection 12*p* of the etch stop layer 12 on the base substrate 19. By having this design, the drain electrode contact region 300 is in an area enclosed by the etch stop layer 12, and the source electrode contact region 200 peripherally surrounds an area corresponding to the etch stop layer 12. Thus, any exposed portion of the active layer 11 along the edge of the etch stop layer 12 in the area not occupied by the source electrode 13 or the drain electrode 14 is electrically connected to the source electrode 13 at its two terminals. Thus, the two terminals of the exposed portion of the active layer 11 have the substantially the same voltage level. As a result, carrier density in the exposed portion of the active layer 11 is substantially zero or very small, effectively preventing the formation of a secondary channel region in the exposed portion. The issue of thermal instability in the conventional thin film transistor due to the increased carrier density in the exposed portion of the active layer 11 along the edge of the etch stop layer 12 in the area not occupied by the source electrode 13 or the drain electrode 14 and electrical damage thereof can be effectively obviated.

Figure 2E:
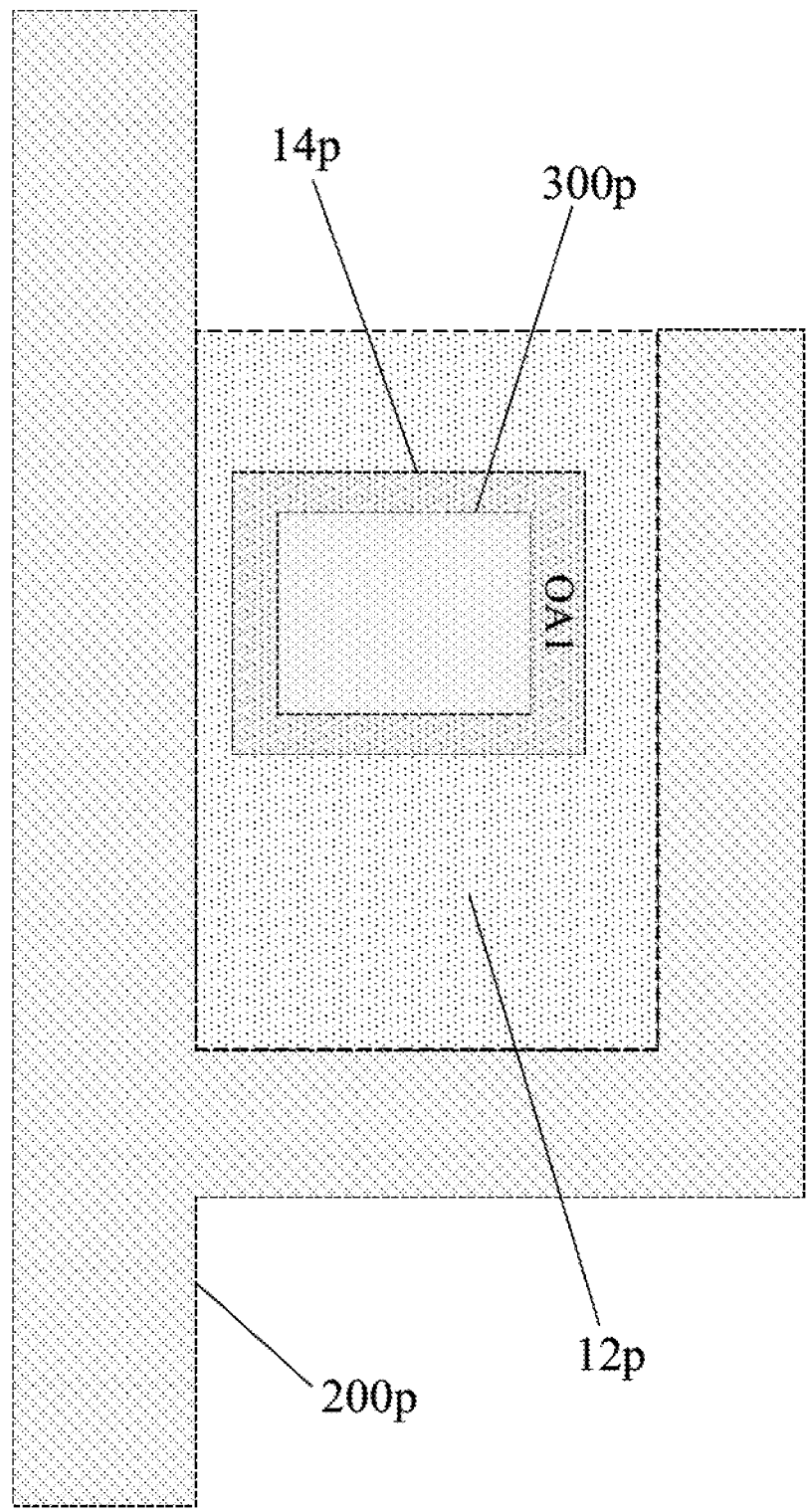
FIG. 2E illustrates projections of various components of the thin film transistor in some embodiments according to the present disclosure.

FIG. 2E illustrates projections of various components of the thin film transistor in some embodiments according to the present disclosure. Referring to FIG. 2E, the orthographic projection 200p of the source electrode contact region 200 on the base substrate 19 is substantially non-overlapping with the orthographic projection 12p of the etch stop layer 12 on the base substrate 19. At least a portion of the orthographic projection 200p of the source electrode contact region 200 abuts the orthographic projection 12p of the etch stop layer 12 (e.g., on a left side and on a right side of the orthographic projection 12p of the etch stop layer 12 in FIG. 2E), and the orthographic projection 200p of the source electrode contact region 200 and the orthographic projection 12p of the etch stop layer 12 are substantially not spaced apart where they abut each other. Optionally, the orthographic projection 200p of the source electrode contact region 200 on the base substrate 19 is substantially the same as an orthographic projection of the source electrode 13 on the base substrate 19. Optionally, at least a portion of the orthographic projection of the source electrode 13 on the base substrate 19 abuts the orthographic projection 12p of the etch stop layer 12 (e.g., on a left side and on a right side of the orthographic projection 12p of the etch stop layer 12), and the orthographic projection of the source electrode 13 on the base substrate 19 and the orthographic projection 12p of the etch stop layer 12 are substantially not spaced apart where they abut each other. Optionally, the orthographic projection 200p of the source electrode contact region 200 on the base substrate 19 at least partially peripherally surrounding the orthographic projection 12p of the etch stop layer 12 on the base substrate 19. Optionally, the orthographic projection 200p of the source electrode contact region 200 on the base substrate 19 surrounds the orthographic projection 12p of the etch stop layer 12 on the base substrate 19 at the external boundary or perimeter of the orthographic projection 12p of the etch stop layer 12 on the base substrate 19. Optionally, the orthographic projection of the source electrode 13 on the base substrate 19 at least partially peripherally surrounding the orthographic projection 12p of the etch stop layer 12 on the base substrate 19.

Referring to FIG. 2A, FIG. 2C and FIG. 2E, the source electrode 13 in some embodiments is disposed partially peripherally surrounding the etch stop layer 12. The source electrode 13 does not completely surround the etch stop layer 12, but leaves at least a portion of the etch stop layer 12 not surrounded by the source electrode 13. For example, referring to FIG. 2A, the source electrode 13 in some embodiments surrounds three sides of the etch stop layer 12, leaving one side of the etch stop layer 12 open. By having this design, the parasitic capacitance between the gate electrode 10 and the source electrode 13 and electrical defects can be effectively minimized. Two terminals of the exposed portion of the active layer 11 along the one side of the etch stop layer 12 that is not surrounded by the source electrode 13 are electrically connected to the source electrode 13, as shown in FIG. 2A. Thus, the two terminals of the exposed portion of the active layer 11 have the substantially the same voltage level. As a result, carrier density in the exposed portion of the active layer 11 is substantially zero or very small, effectively preventing the formation of a secondary channel region in the exposed portion.

Figure 2F:
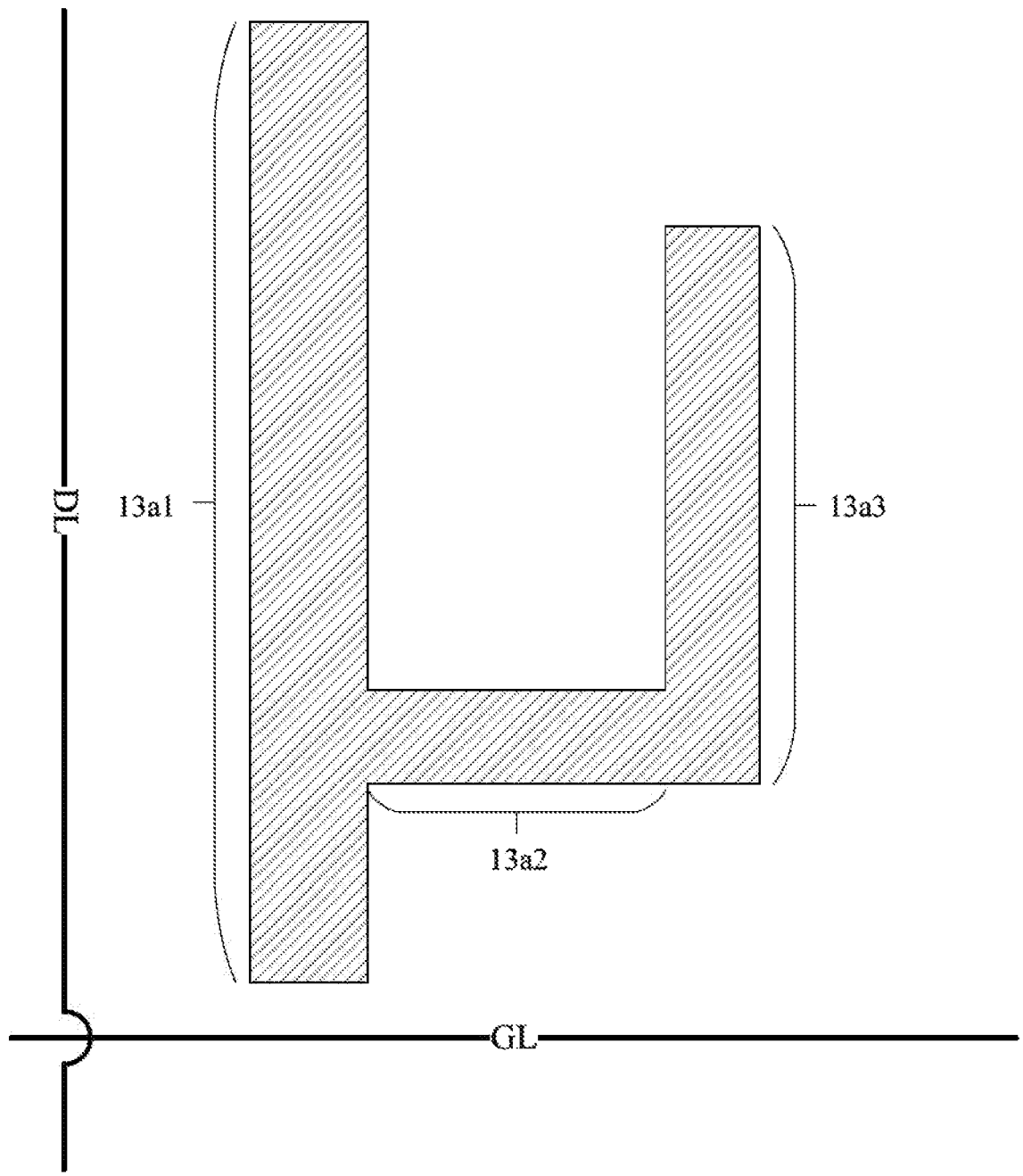
FIG. 2F is a schematic diagram illustrating the structure of a source electrode in some embodiments according to the present disclosure.

FIG. 2F is a schematic diagram illustrating the structure of a source electrode in some embodiments according to the present disclosure. Referring to FIG. 2F, the source electrode 13 in some embodiments includes a first portion 13a1, a second portion 13a2, and a third portion 13a3 connecting the first portion 13a1 and the second portion 13a2. The portion 13a1, the second portion 13a2, and the third portion 13a3 form a structure having a substantially U shape. Accordingly, the source electrode 13 has a substantially U shape. In an array substrate having a plurality of gate lines GL and a plurality of data lines DL, the first portion 13a1 and the second portion 13a2 extend along a direction substantially parallel to one of the plurality of data lines DL, and the third portion 13a3 extends along a direction substantially parallel to one of the plurality of gate lines GL.

Figure 2G:
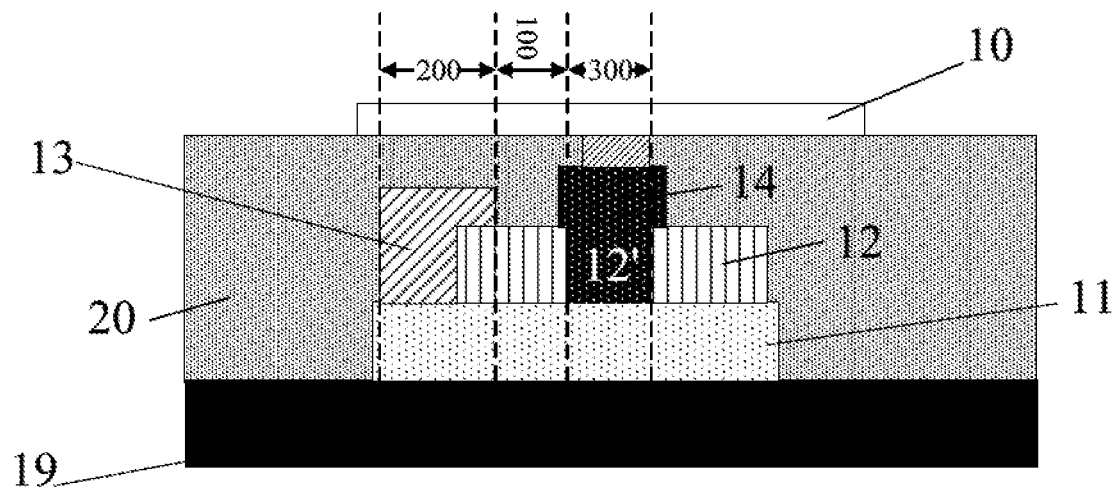
FIG. 2G is a schematic diagram illustrating the structure of a thin film transistor in some embodiments according to the present disclosure.

FIG. 2G is a schematic diagram illustrating the structure of a thin film transistor in some embodiments according to the present disclosure. Referring to FIG. 2G, the thin film transistor in some embodiments is a top-gate thin film transistor. The thin film transistor in some embodiments includes a base substrate 19; an active layer 11 on the base substrate; an etch stop layer 12 on a side of the active layer 11 distal to the gate insulating layer 20; a source electrode 13 and a drain electrode 14 on a side of the etch stop layer 12 distal to the active layer 11; a gate insulating layer 20 on a side of the source electrode 13, the drain electrode 14, and the etch stop layer 12 distal to the active layer 11; and a gate electrode 10 on a side of the gate insulating layer 20 distal to the base substrate 19. The active layer 11 includes a channel region 100, a source electrode contact region 200, and a drain electrode contact region 300.

Figure 2H:
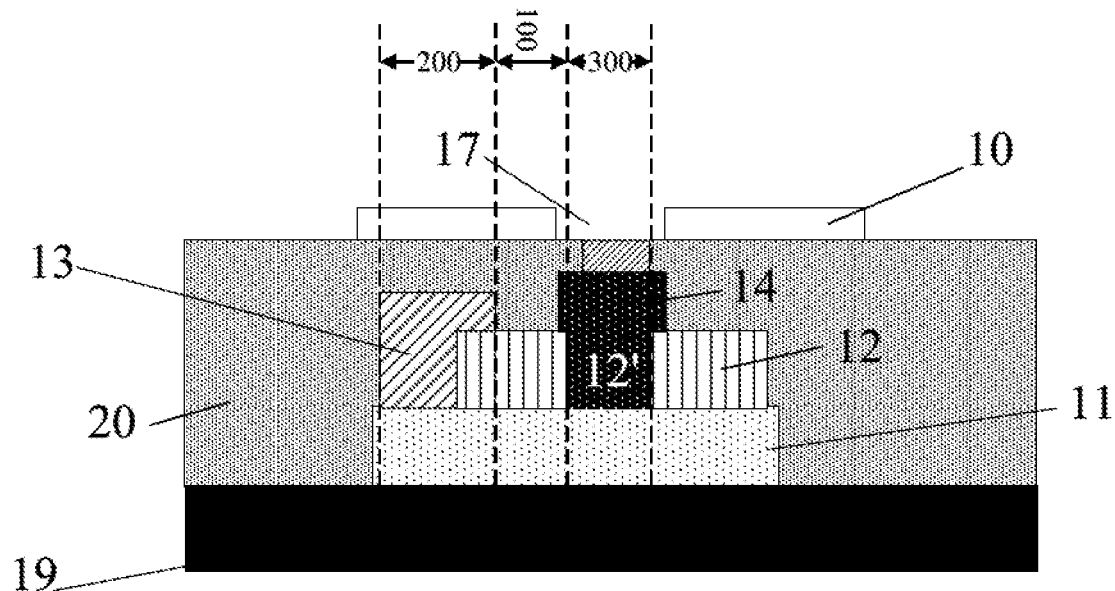
FIG. 2H is a schematic diagram illustrating the structure of a thin film transistor in some embodiments according to the present disclosure.

FIG. 2H is a schematic diagram illustrating the structure of a thin film transistor in some embodiments according to the present disclosure. Referring to FIG. 2H, the thin film transistor in some embodiments further includes a second via 17 extending through the gate electrode 10. An orthographic projection of the second via 17 at least partially overlaps with the orthographic projection of the first via 12'. In FIG. 2H, the orthographic projection of the second via 17 substantially overlaps with the orthographic projection of the first via 12'. By having a second via 17 extending through the gate electrode 10 at a position corresponding to the first via 12', the parasitic capacitance between the gate electrode 10 and the drain electrode 14 (which extends through the first via 12') and electrical defects can be effectively minimized.

Figure 3:
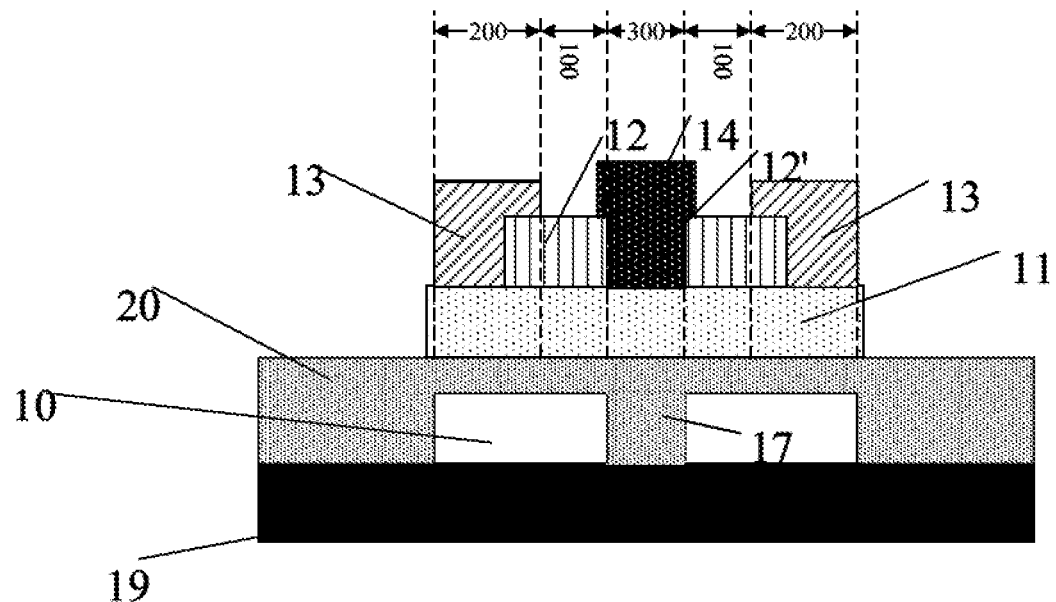
FIG. 3 is a schematic diagram illustrating the structure of a thin film transistor in some embodiments according to the present disclosure.

FIG. 3 is a schematic diagram illustrating the structure of a thin film transistor in some embodiments according to the present disclosure. Referring to FIG. 3, the thin film transistor in some embodiments further includes a second via 17 extending through the gate electrode 10. An orthographic projection of the second via 17 at least partially overlaps with the orthographic projection of the first via 12'. In FIG. 3, the orthographic projection of the second via 17 substantially overlaps with the orthographic projection of the first via 12'. The gate insulating layer 20 fills in and extends through the second via 17. By having a second via 17 extending through the gate electrode 10 at a position corresponding to the first via 12', the parasitic capacitance between the gate electrode 10 and the drain electrode 14 (which extends through the first via 12') and electrical defects can be effectively minimized.

Figure 4A:
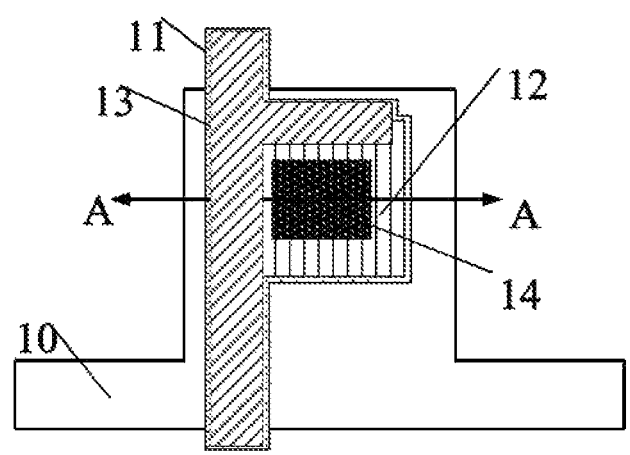
FIG. 4A is a schematic diagram illustrating the structure of a thin film transistor in some embodiments according to the present disclosure.
Figure 4B:
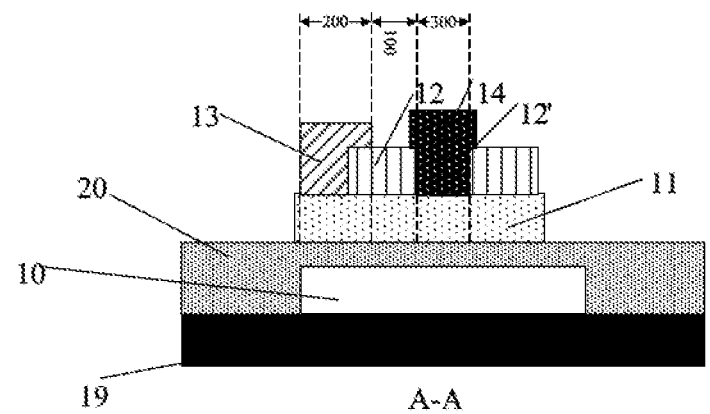
FIG. 4B is a cross-sectional view along the line A-A in FIG. 4A.
Figure 4C:
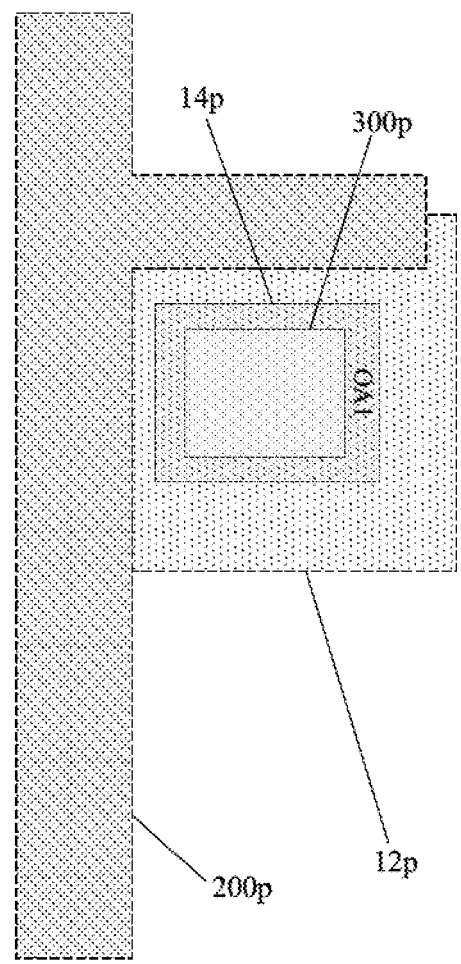
FIG. 4C illustrates projections of various components of the thin film transistor in some embodiments according to the present disclosure.
Figure 4D:
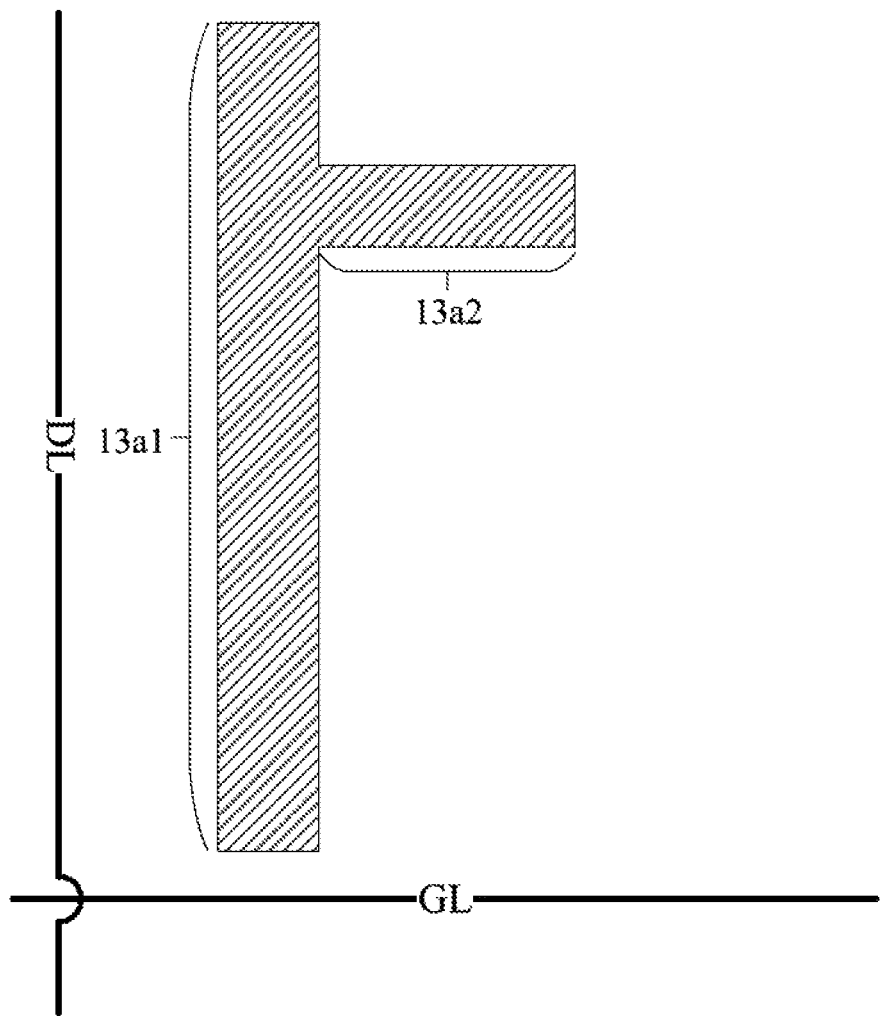
FIG. 4D is a schematic diagram illustrating the structure of a source electrode in some embodiments according to the present disclosure.

FIG. 4A is a schematic diagram illustrating the structure of a thin film transistor in some embodiments according to the present disclosure. FIG. 4B is a cross-sectional view along the line A-A in FIG. 4A. Referring to FIG. 4A and FIG. 4B, the source electrode 13 in some embodiments has a substantially L shape. FIG. 4C illustrates projections of various components of the thin film transistor in some embodiments according to the present disclosure. Referring to FIG. 4C, an orthographic projection 200p of the source electrode contact region 200 in some embodiments has a substantially L shape. Accordingly, the source electrode contact region 200 in some embodiments also has a substantially L shape. FIG. 4D is a schematic diagram illustrating the structure of a source electrode in some embodiments according to the present disclosure. Referring to FIG. 4D, the source electrode 13 in some embodiments includes a first portion 13a1 and a second portion 13a2 connected to the first portion 13a1. The first portion 13a1 and the second portion 13a2 form a structure having a substantially L shape. Accordingly, the source electrode 13 has a substantially L shape. In an array substrate having a plurality of gate lines GL and a plurality of data lines DL, the first portion 13a1 extends along a direction substantially parallel to one of the plurality of data lines DL, and the second portion 13a2 extends along a direction substantially parallel to one of the plurality of gate lines GL.

As compared to the U-shaped source electrode depicted in FIG. 2F, the L-shaped source electrode depicted in FIG. 4D has a reduced parasitic capacitance with the gate electrode 10 and the gate line GL, as the L-shaped source electrode does not have a portion (e.g., the second portion 13a2 of the U-shaped source electrode depicted in FIG. 2F) that has the most overlapping area with the gate electrode 10 and gate line GL.

Optionally, source electrode 13 in some embodiments has a substantially a T shape.

Figure 5:
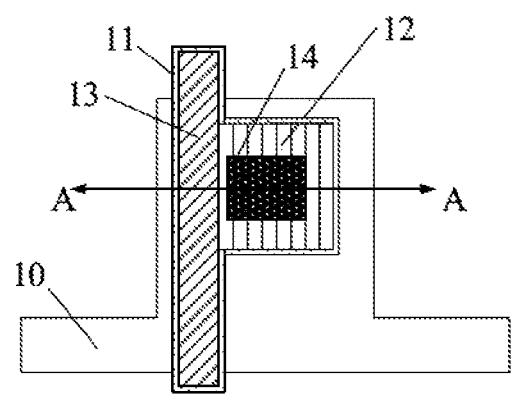
FIG. 5 is a schematic diagram illustrating the structure of a thin film transistor in some embodiments according to the present disclosure.

FIG. 5 is a schematic diagram illustrating the structure of a thin film transistor in some embodiments according to the present disclosure. Referring to FIG. 5, the source electrode 13 in some embodiments has a substantially a bar shape (or an I shape).

In another aspect, the present disclosure provides an array substrate having a thin film transistor described herein or fabricated by a method described herein. FIGS. 6 and 7 are schematic diagrams illustrating the structure of an array substrate in some embodiments according to the present disclosure. Referring to FIGS. 6 and 7, the array substrate further includes a passivation layer 15 on a side of the source electrode 13 and the drain electrode 14 distal to the active layer 11; a third via 18 extending through the passivation layer 15; and a pixel electrode layer 16 on a side of the passivation layer 15 distal to the active layer 11. The pixel electrode layer 16 extends through the third via 18 and is electrically connected to the drain electrode 14 through the third via 18. Optionally, an orthographic projection of the pixel electrode layer 16 on the base substrate 19 is substantially non-overlapping with an orthographic projection of the source electrode 13 on the base substrate 19.

Figure 6A:
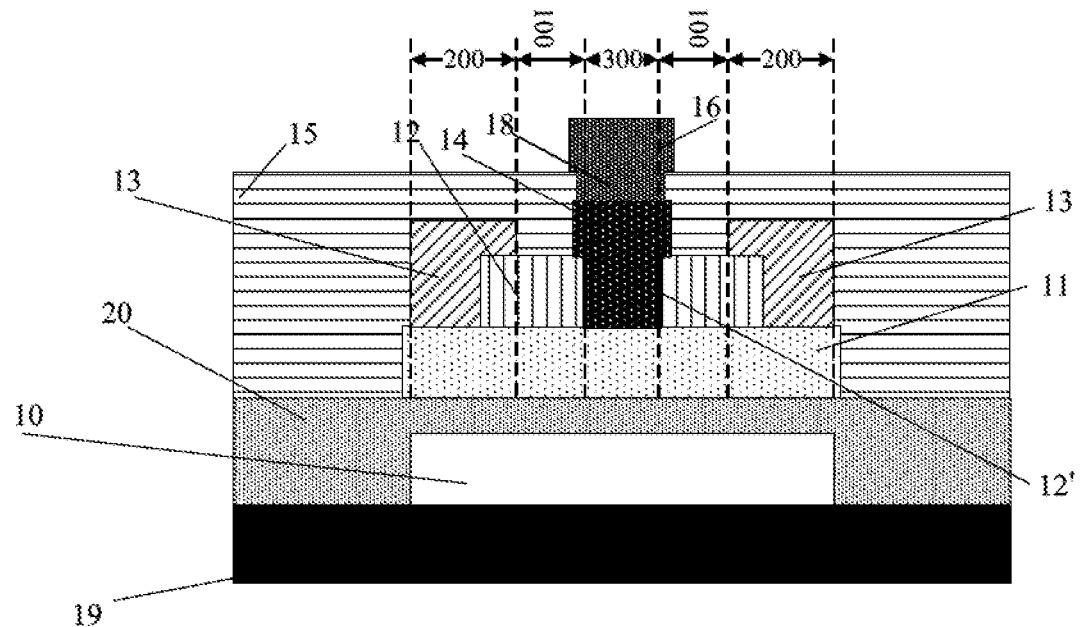
FIG. 6A is a schematic diagram illustrating the structure of an array substrate in some embodiments according to the present disclosure.

Referring to FIG. 6A and FIG. 2F, the array substrate in some embodiments further includes a plurality of gate lines GL and a plurality of data lines DL. The source electrode 13 includes a first portion 13a1, a second portion 13a2, and a third portion 13a3 connecting the first portion 13a1 and the second portion 13a2. The first portion 13a1, the second portion 13a2, and the third portion 13a3 form a substantially U-shape structure. The third portion 13a3 extends along a direction substantially parallel to one of the plurality of gate lines GL. The first portion 13a1 and the second portion 13a2 extend along a direction substantially parallel to one of the plurality of data lines DL.

Figure 7A:
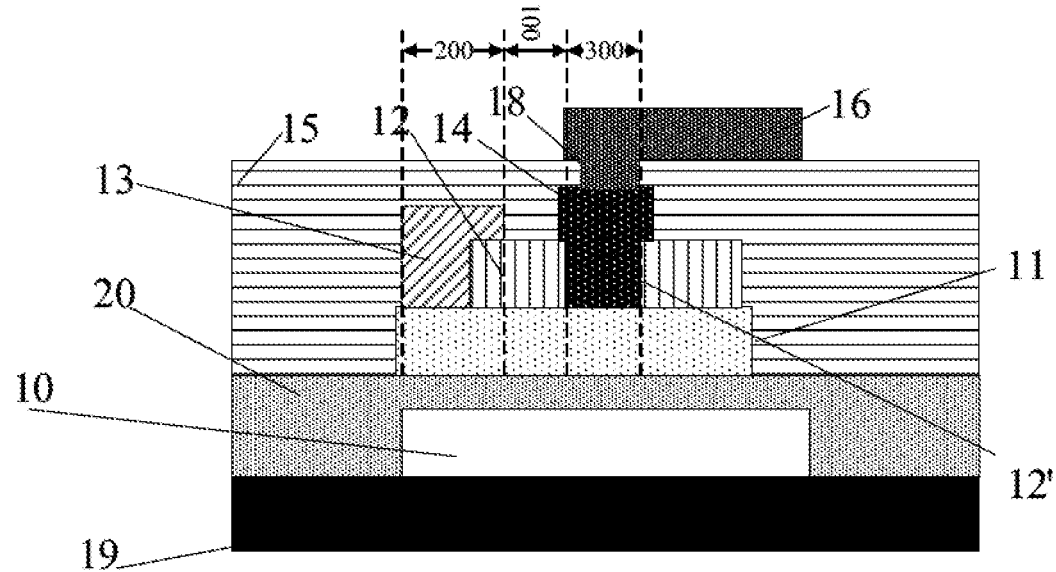
FIG. 7A is a schematic diagram illustrating the structure of an array substrate in some embodiments according to the present disclosure.

Referring to FIG. 7A and FIG. 4D, the array substrate in some embodiments further includes a plurality of gate lines GL and a plurality of data lines DL. The source electrode 13 in some embodiments includes a first portion 13a1 and a second portion 13a2 connected to the first portion 13a1. The first portion 13a1 and the second portion 13a2 form a structure having a substantially L shape. The first portion 13a1 extends along a direction substantially parallel to one of the plurality of data lines DL. The second portion 13a2 extends along a direction substantially parallel to one of the plurality of gate lines GL.

Referring to FIGS. 6A and 7A, the array substrate includes a third via 18 extending through the passivation layer 15. Typically, the minimum width of the third via 18 is approximately 4 μm (due to the limitation of the fabrication process), e.g., the third via 18 in some embodiments has a minimum area of 4 μm by 4 μm. In the fabrication process of the array substrate, taking into account of misalignment error between the drain electrode 14 and the first via 12', the minimum width of the drain electrode 14 is approximately 6 μm in order to ensure that the drain electrode 14 completely covers the first via 12'. For example, the drain electrode 14 has a minimum area of 6 μm by 6 μm. Optionally, the length of the channel region 100 is approximately 4 μm. Accordingly, the width of the channel region 100 between the source electrode 13 and the drain electrode 14 would be approximately 16 μm or more. Considering that the material of the active layer 11 has a relatively high mobility rate, a width:length ratio of the channel region of approximately 16:4 would satisfy the demand of most of the products.

As compared to a thin film transistor having a U-shaped source electrode, a thin film transistor having a L-shaped source electrode has one less branch in the source electrode 13. For example, the second portion 13a2 of the U-shaped source electrode is absent in the L-shaped source electrode. Accordingly, the channel region is also absent in the area corresponding to the missing branch. As a result, the etch stop layer 12 may be made narrower, and the thin film transistor can be made smaller, effectively enhancing the aperture ratio of the array substrate.

Figure 6B:
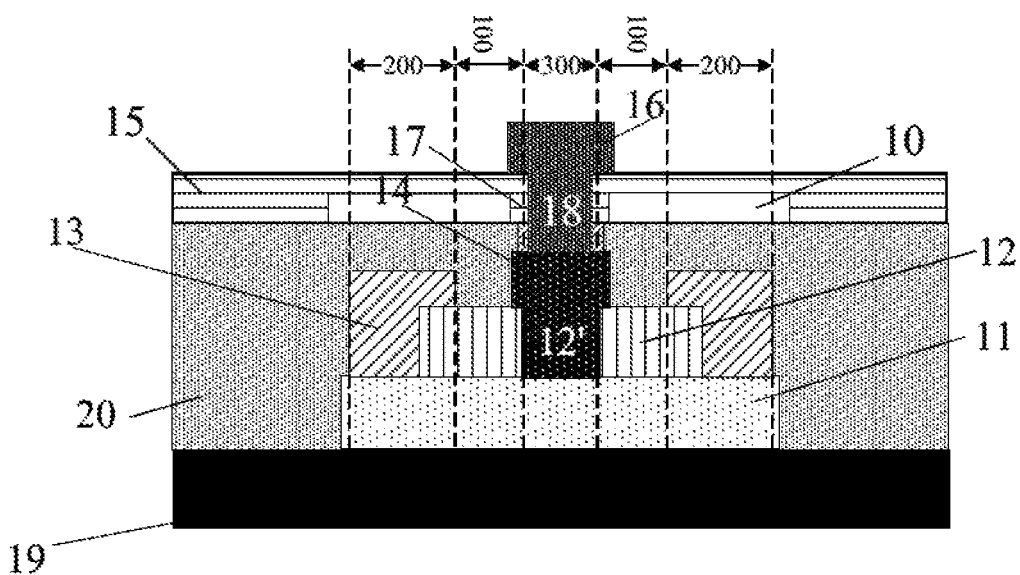
FIG. 6B is a schematic diagram illustrating the structure of an array substrate in some embodiments according to the present disclosure.
Figure 7B:
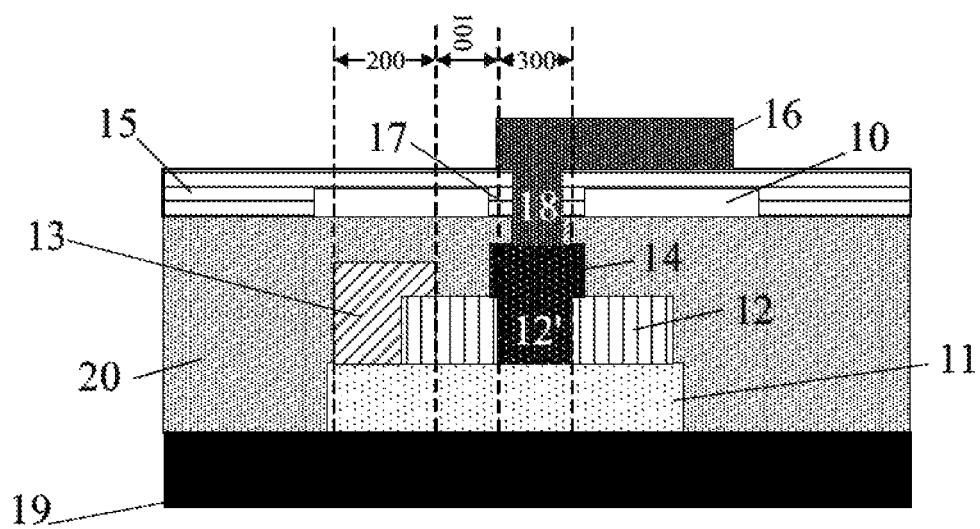
FIG. 7B is a schematic diagram illustrating the structure of an array substrate in some embodiments according to the present disclosure.

FIG. 6B is a schematic diagram illustrating the structure of an array substrate in some embodiments according to the present disclosure. FIG. 7B is a schematic diagram illustrating the structure of an array substrate in some embodiments according to the present disclosure. Referring to FIG. 6B and FIG. 7B, in some embodiments, the thin film transistor in the array substrate is a top-gate type thin film transistor. The thin film transistor further includes a gate electrode 10 and a second via 17 extending through the gate electrode 10; and a gate insulating layer 20 on a side of the gate electrode 10 proximal to the active layer 11, the source electrode 13, and the drain electrode 14. The array substrate further includes a passivation layer 15 on a side of the gate electrode 10 distal to the gate insulating layer 20. The passivation layer 15 extends through the second via 17. An orthographic projection of the second via 17 at least partially overlaps (e.g., substantially overlaps) with the orthographic projection of the first via 12'. The array substrate further includes a third via 18 extending through the passivation layer 15 and the gate insulating layer 20; and a pixel electrode layer 16 on a side of the passivation layer 15 distal to the active layer 11. The pixel electrode layer 16 extends through the third via 18 and is electrically connected to the drain electrode 14 through the third via 18. Optionally, the orthographic projection of the second via 17 surrounds an orthographic projection of the third via 18. Optionally, an orthographic projection of the pixel electrode layer 16 on the base substrate 19 is substantially non-overlapping with an orthographic projection of the source electrode 13 on the base substrate 19.

In another aspect, the present disclosure provides a display apparatus having a thin film transistor described herein or fabricated by a method described herein. Examples of appropriate display apparatuses include, but are not limited to, a liquid crystal display panel, an electronic paper, an organic light emitting display panel, a mobile phone, a tablet computer, a television, a monitor, a notebook computer, a digital album, a GPS, etc.

In another aspect, the present disclosure provides a method of fabricating a thin film transistor. In some embodiments, the method includes forming a gate electrode on a base substrate; forming an active layer, forming a gate insulating layer, the gate insulating layer formed between the gate electrode and the active layer forming an etch stop layer on a side of the active layer distal to the base substrate; and forming a source electrode and a drain electrode on a side of the etch stop layer distal to the active layer. The active layer is formed to include a channel region, a source electrode contact region, and a drain electrode contact region. Optionally, the etch stop layer is formed so that an orthographic projection of the etch stop layer on the base substrate surrounds an orthographic projection of the drain electrode contact region on the base substrate, and an orthographic projection of the source electrode contact region on the base substrate at least partially peripherally surrounding the orthographic projection of the etch stop layer on the base substrate. Optionally, the step of forming the active layer includes forming a semiconductor material layer; and subsequent to forming the source electrode, the drain electrode, and the etch stop layer, patterning the semiconductor material layer using the source electrode, the drain electrode, and the etch stop layer as a mask plate, thereby forming the active layer. Optionally, the step of patterning the semiconductor material layer includes removing the semiconductor material layer outside the regions corresponding to the source electrode, the drain electrode, and the etch stop layer.

In some embodiments, the active layer is made of a material comprising $M1O_aN_b$, wherein M1 is a single metal or a combination of metals, a>0, and b≥0, e.g., the active layer is made of a metal oxide material or a metal oxynitride material. Examples of appropriate metal oxide active layer materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material comprising $M1O_aN_b$ doped with one or more metal element. Optionally, the active layer is made of a material comprising $M1O_aN_b$ doped with one or more non-metal element. Optionally, the active layer is made of a material comprising $M1O_aN_b$ doped with one or more metal element and one or more non-metal element.

Optionally, the etch stop layer is substantially resistant to an etchant for etching the first node and the second node (e.g., the source electrode and the drain electrode). Optionally, the etch stop layer is substantially resistant to a wet etchant for etching the first node and the second node.

Optionally, the etch stop layer is made of a silicon-containing compound. Examples of silicon-containing compounds for making the etch stop layer include, but are not limited to, silicon oxide, silicon nitride, silicon oxynitride, silicon carbide, silicon oxycarbide, silicon, and silicon germanium.

In some embodiments, the method further includes forming a first via extending through the etch stop layer. Optionally, the drain electrode is formed to be electrically connected to the drain electrode contact region through the first via. Optionally, an orthographic projection of the drain electrode on the base substrate completely covers an orthographic projection of the first via and an orthographic projection of the drain electrode contact region on the base substrate. Optionally, the etch stop layer and the drain electrode are formed so that the orthographic projection of the etch stop layer on the base substrate completely surrounds an orthographic projection of the drain electrode on the base substrate, and partially overlaps with the orthographic projection of the drain electrode on the base substrate resulting in an overlapping area. Optionally, the overlapping area completely surrounds the orthographic projection of the first via and the orthographic projection of the drain electrode contact region on the base substrate.

In some embodiments, the method further includes forming a second via extending through the gate electrode. Optionally, the first via and the second via are formed so that an orthographic projection of the second via at least partially overlaps with the orthographic projection of the first via. Optionally, the first via and the second via are formed so that the orthographic projection of the second via substantially overlaps with the orthographic projection of the first via. Optionally, the gate insulating layer is formed to extend through the second via.

In some embodiments, the thin film transistor is a top-gate thin film transistor. The method in some embodiments includes forming an active layer on a base substrate; forming an etch stop layer on a side of the active layer distal to the gate insulating layer, forming a source electrode and a drain electrode on a side of the etch stop layer distal to the active layer forming a gate insulating layer on a side of the source electrode, the drain electrode, and the etch stop layer distal to the active layer; and forming a gate electrode on a side of the gate insulating layer distal to the base substrate. The active layer is formed to include a channel region, a source electrode contact region, and a drain electrode contact region.

In some embodiments, the method further includes forming a second via extending through the gate electrode. Optionally, the first via and the second via are formed so that an orthographic projection of the second via at least partially overlaps with the orthographic projection of the first via. Optionally, the first via and the second via are formed so that the orthographic projection of the second via substantially overlaps with the orthographic projection of the first via.

In some embodiments, the source electrode contact region is formed to have a substantially U shape. Optionally, the source electrode is formed to include a first portion, a second portion, and a third portion connecting the first portion and the second portion. Optionally, the first portion, the second portion, and the third portion form a structure having a substantially U shape.

In some embodiments, the source electrode contact region is formed to have a substantially L shape. Optionally, the source electrode is formed to include a first portion and a second portion connecting to the first portion. Optionally, the first portion and the second portion form a structure having a substantially L shape.

In another aspect, the present disclosure further provides a method of forming an array substrate. In some embodiments, the method includes forming a thin film transistor according to the method of fabricating the thin film transistor described herein. Optionally, the method further includes forming a passivation layer on a side of the source electrode and the drain electrode distal to the active layer; forming a third via extending through the passivation layer, and forming a pixel electrode layer on a side of the passivation layer distal to the active layer. Optionally, the pixel electrode layer is formed to extend through the third via and is electrically connected to the drain electrode through the third via. Optionally, the pixel electrode layer is formed so that an orthographic projection of the pixel electrode layer on the base substrate is substantially non-overlapping with an orthographic projection of the source electrode on the base substrate.

Figure 8A:
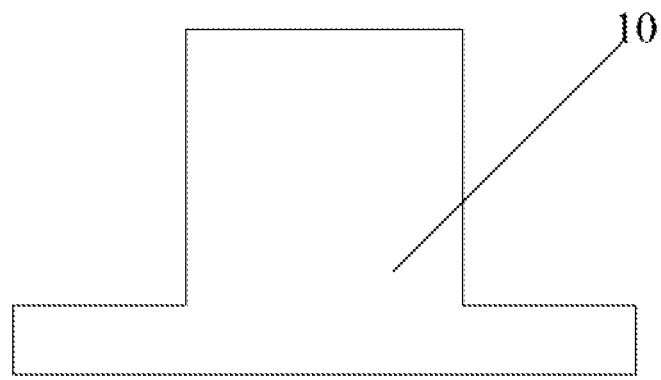
FIGS. 8A to 8E illustrate a process of fabricating a thin film transistor in some embodiments according to the present disclosure.

FIGS. 8A to 8E illustrate a process of fabricating a thin film transistor in some embodiments according to the present disclosure. Referring to FIG. 8A, the method of fabricating the thin film transistor in some embodiments includes forming a gate electrode 10 on a base substrate. Various appropriate materials and various appropriate fabricating methods may be used to make the gate electrode 10. For example, a metal material may be deposited by a plasma-enhanced chemical vapor deposition (PECVD) process or a sputtering process, e.g., a magnetron sputtering process. The deposited metal material layer is then patterned, e.g., by a lithographic process. Examples of appropriate metal materials for making the gate electrode 10 include, but are not limited to, a metal material having relatively high electrical conductivity such as copper and aluminum.

Subsequently, a gate insulating layer 20 is formed on a side of the gate electrode layer 10 distal to the base substrate 19. Various appropriate materials and various appropriate fabricating methods may be used to make the gate insulating layer 20. For example, an insulating material may be deposited by a plasma-enhanced chemical vapor deposition (PECVD) process. Examples of appropriate insulating materials for making the gate insulating layer 20 include, but are not limited to, silicon oxide and silicon nitride.

Figure 8B:
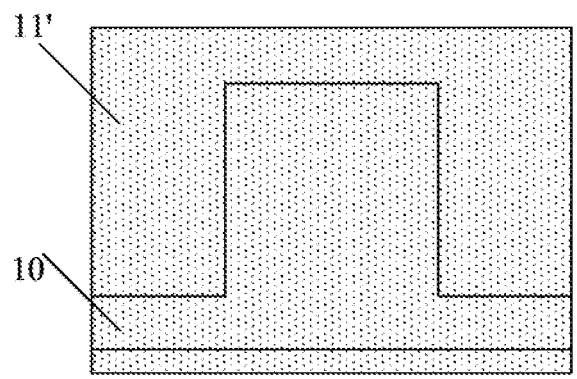

Referring to FIG. 8B, a semiconductor material layer 11' is formed on a side of the gate insulating layer 20 distal to the base substrate 19. Various appropriate materials and various appropriate fabricating methods may be used to make the semiconductor material layer 11'. For example, a semiconductor material may be deposited by a plasma-enhanced chemical vapor deposition (PECVD) process or a sputtering process, e.g., a magnetron sputtering process. Examples of appropriate semiconductor materials for making the semiconductor material layer 11' include, but are not limited to, metal oxides such as indium gallium zinc oxide. Optionally, the semiconductor material layer 11' is formed to have a thickness in a range of approximately 200 Å to approximately 500 Å

Figure 8C:
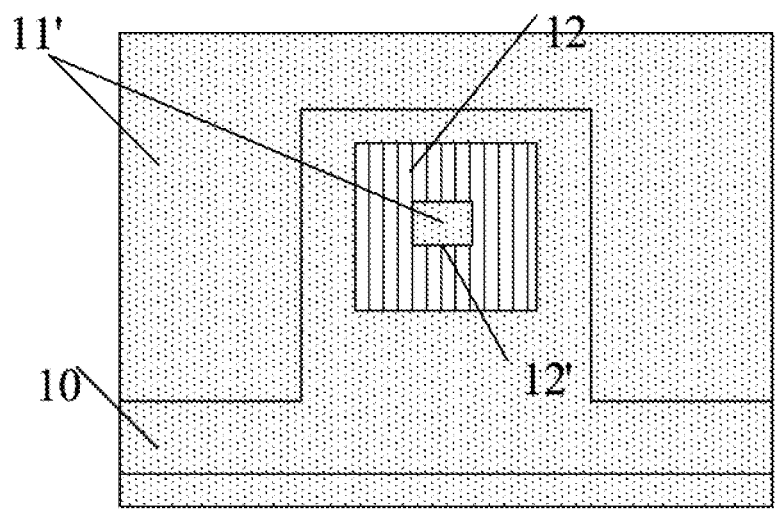

Referring to FIG. 8C, an etch stop layer 12 is formed on a side of the active layer 11 distal to the gate insulating layer 20. The method further includes forming a first via 12' extending through the etch stop layer 12. Various appropriate materials and various appropriate fabricating methods may be used to make the etch stop layer 12. For example, an etch stop material may be deposited by a plasma-enhanced chemical vapor deposition (PECVD) process. The deposited etch stop material layer is then patterned, e.g., by a lithographic process. Examples of appropriate etch stop materials for making the etch stop layer 12 include, but are not limited to, silicon oxide. Optionally, the etch stop layer 12 is formed to have a thickness in a range of approximately 1000 Å to approximately 1500 Å.

Figure 8D:
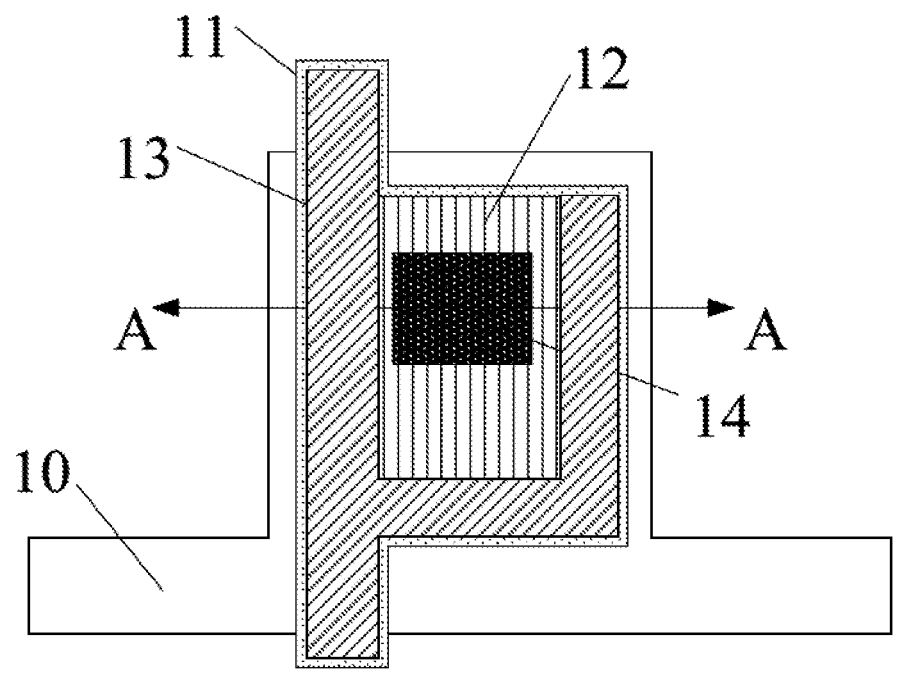
Figure 8E:
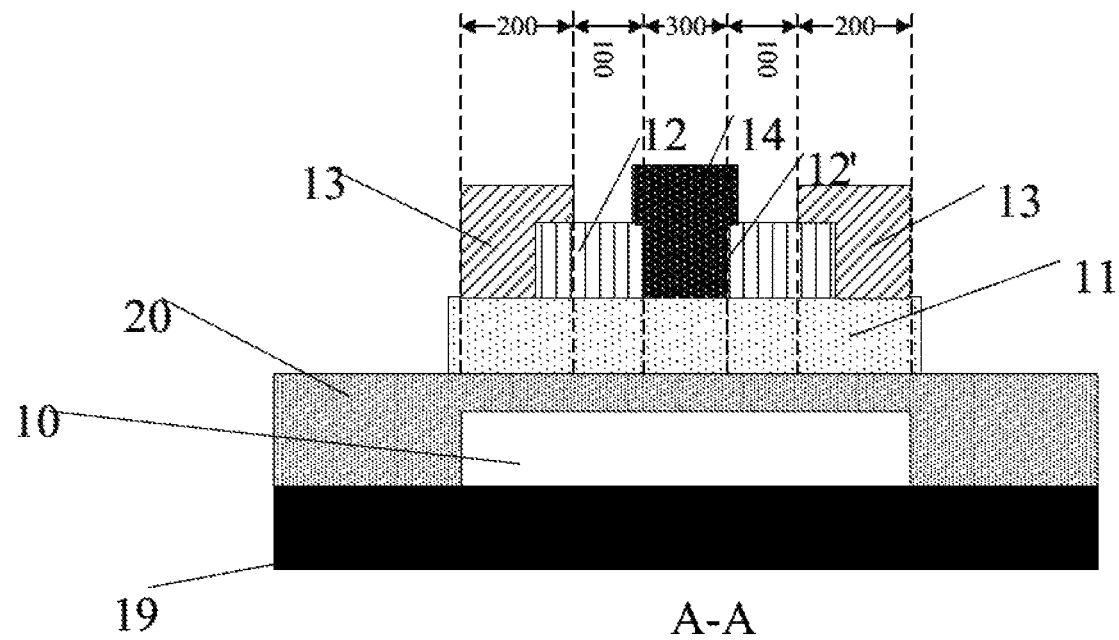

Referring to FIG. 8D, a source electrode 13 and a drain electrode 14 are formed on a side of the etch stop layer 12 distal to the active layer 11. The source electrode 13, the drain electrode 14, and the etch stop layer 12 are formed so that an orthographic projection of the etch stop layer 12 on the base substrate 19 surrounds an orthographic projection of the drain electrode contact region 300 on the base substrate 19; and an orthographic projection of the source electrode contact region 200 on the base substrate 19 at least partially peripherally surrounding the orthographic projection of the etch stop layer 12 on the base substrate 19. Various appropriate materials and various appropriate fabricating methods may be used to make the source electrode 13 and the drain electrode 14. For example, a metallic material may be deposited by a sputtering process, e.g., a magnetron sputtering process. The deposited metallic material layer is then patterned, e.g., by a lithographic process. Examples of appropriate metallic materials for making the source electrode 13 and the drain electrode 14 include, but are not limited to, a laminated layer having a copper sublayer and a molybdenum:niobium sublayer.

In some embodiments, the step of forming the active layer 11 includes patterning the semiconductor material layer 11' using the source electrode 13, the drain electrode 14, and the etch stop layer 12 as a mask plate. Referring to FIG. 5E, the active layer is formed to include a channel region 100, a source electrode contact region 200, and a drain electrode contact region 300.

Referring to FIG. BE, the drain electrode 14 is formed to be electrically connected to the drain electrode contact region 300 through the first via 12'. The drain electrode 14 is formed so that an orthographic projection of the drain electrode 14 on the base substrate 19 completely covers an orthographic projection of the first via 12' and an orthographic projection of the drain electrode contact region 300 on the base substrate 19. Optionally, the etch stop layer 12 and the drain electrode 14 are formed so that the orthographic projection of the etch stop layer 12 on the base substrate 19 completely surrounds an orthographic projection of the drain electrode 14 on the base substrate 19, and partially overlaps with the orthographic projection of the drain electrode 14 on the base substrate 19, resulting in an overlapping area. Referring to FIG. 2C, the overlapping area OA1 completely surrounds the orthographic projection of the first via 12' and the orthographic projection of the drain electrode contact region 300 on the base substrate 19.

Figure 9A:
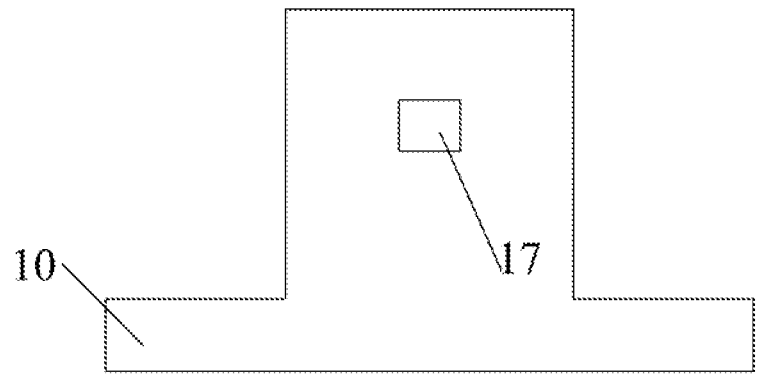
FIGS. 9A to 9B illustrate a process of fabricating a thin film transistor in some embodiments according to the present disclosure.
Figure 9B:
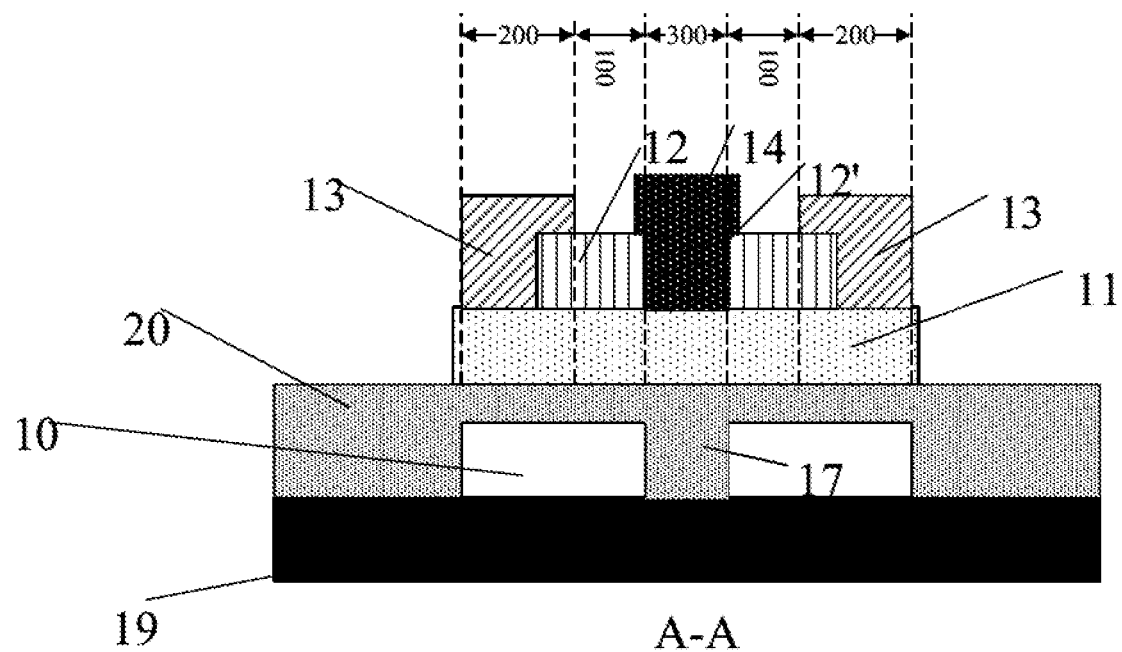

FIGS. 9A to 9B illustrate a process of fabricating a thin film transistor in some embodiments according to the present disclosure. The process depicted in FIGS. 9A to 9B is substantially similar to that depicted in FIG. 8A to SE except that the thin film transistor is formed to include a second via extending through the gate electrode. Referring to FIG. 9A, the step of forming the gate electrode 10 includes forming a second via 17 extending through the gate electrode 10. The second via 17 may be formed during the patterning process for forming the gate electrode 10. Optionally, the first via 12' and the second via 17 are formed so that an orthographic projection of the second via 17 at least partially overlaps with the orthographic projection of the first via 12'. Optionally, the first via 12' and the second via 17 are formed so that an orthographic projection of the second via 17 substantially overlaps with the orthographic projection of the first via 12'.

Referring to FIG. 9B, in some embodiments, the step of forming the gate insulating layer is performed so that the gate insulating layer is formed to extend through the second via.

Figure 10A:
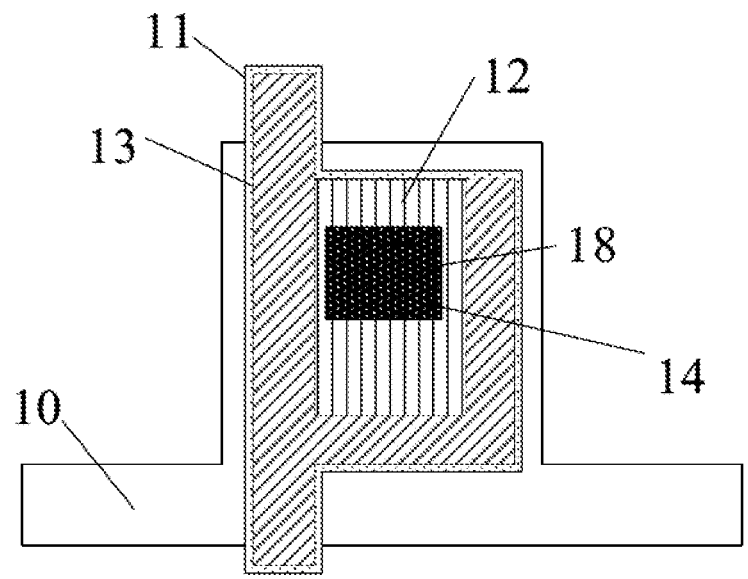
FIGS. 10A to 10C illustrate a process of fabricating an array substrate in some embodiments according to the present disclosure.
Figure 10B:
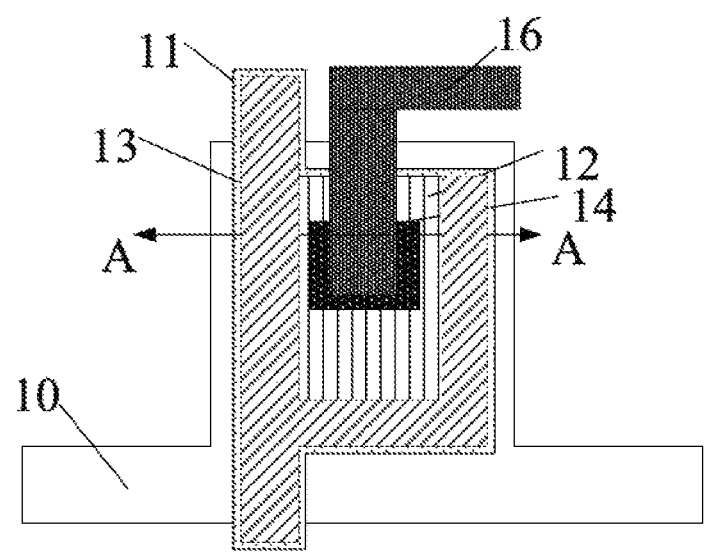
Figure 10C:
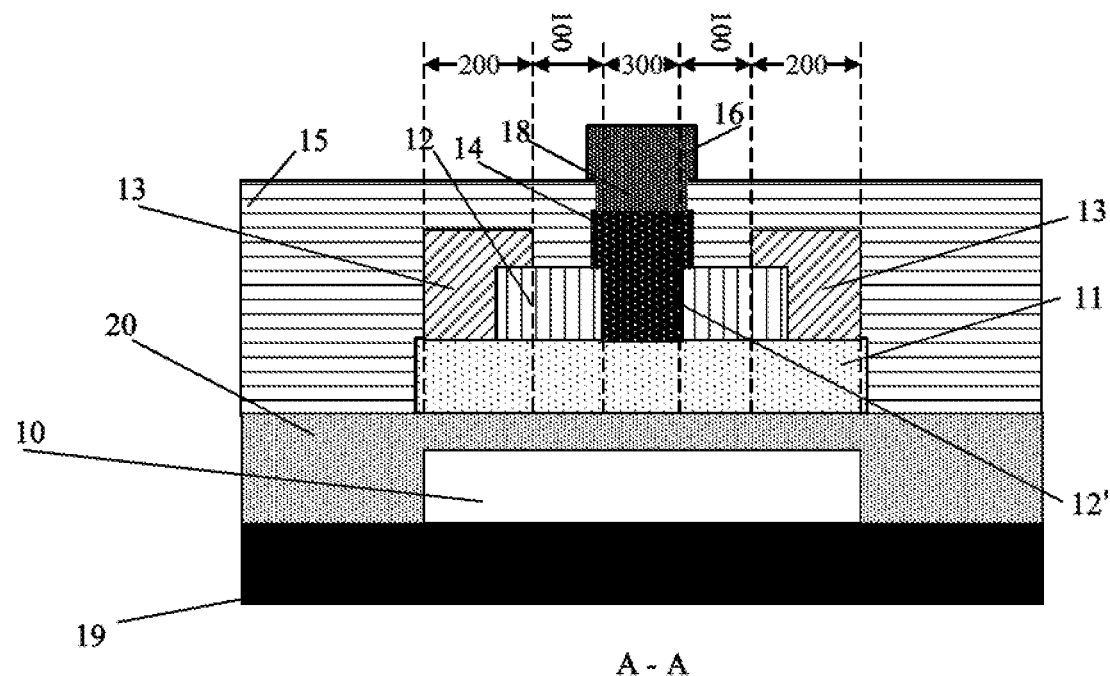

In another aspect, the present disclosure further provides a method of fabricating an array substrate. In some embodiments, the method of fabricating the array substrate includes the steps of fabricating the thin film transistor described herein. FIGS. 10A to 10C illustrate a process of fabricating an array substrate in some embodiments according to the present disclosure. Referring to 10A, a thin film transistor is first formed according to the method described above. Referring to 10C, a passivation layer 15 is then formed on a side of the source electrode 13 and the drain electrode 14 distal to the active layer 11. A third via 18 is then formed, extending through the passivation layer 15. Various appropriate materials and various appropriate fabricating methods may be used to make the passivation layer 15. For example, an insulating material may be deposited by a plasma-enhanced chemical vapor deposition (PECVD) process. The deposited insulating material layer is then patterned, e.g., by a lithographic process, to form the third via 18. Examples of appropriate insulating materials for making the passivation layer 15 include, but are not limited to, silicon oxide and silicon nitride. Optionally, the etch stop layer 12 is formed to have a thickness in a range of approximately 1000 Å to approximately 1500 Å.

Referring to FIG. 10B and FIG. 10C, a pixel electrode layer 16 is then formed on a side of the passivation layer 15 distal to the active layer 11. The pixel electrode layer 16 is formed to extend through the third via 18 and is electrically connected to the drain electrode 14 through the third via 18. Various appropriate materials and various appropriate fabricating methods may be used to make the pixel electrode layer 16. For example, a conductive material may be deposited by a sputtering process, e.g., a magnetron sputtering process. The deposited conductive material layer is then patterned, e.g., by a lithographic process. Examples of appropriate conductive materials for making the pixel electrode layer 16 include, but are not limited to, metal oxides such as indium tin oxide. Optionally, the pixel electrode layer 16 is formed to have a thickness in a range of approximately 400 Å to approximately 800 Å.

In some embodiments, the pixel electrode layer 16 is formed so that an orthographic projection of the pixel electrode layer 16 on the base substrate 19 is substantially non-overlapping with an orthographic projection of the source electrode 13 on the base substrate 19. Referring to FIG. 10B, the source electrode 13 is formed to have a substantially U shape. A first terminal of the pixel electrode layer 16 is electrically connected to the drain electrode 14 through the third via 18. A second terminal of the pixel electrode layer 16 is extends away from the drain electrode 14 through the opening in the U-shaped source electrode 13. By having this design, the parasitic capacitance between the pixel electrode layer 16 and the source electrode 13 can be effectively minimized. Because the source electrode 13 is absent in the area corresponding to the opening in the U shape, a step-wise elevation due to the source electrode does not exist in this area. Accordingly, the pixel electrode layer 16 can extend into this area to be electrically connected to the drain electrode 14 without the step-wise elevation, significantly reducing the risk of line break and other related defects.

Figure 11A:
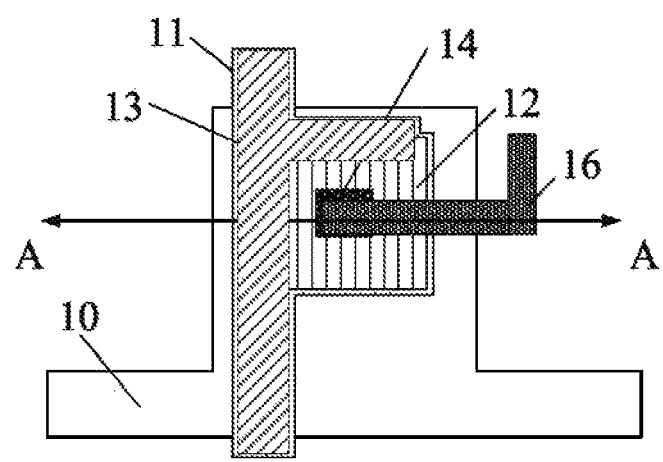
FIGS. 11A to 11C illustrate a process of fabricating an array substrate in some embodiments according to the present disclosure.
Figure 11B:
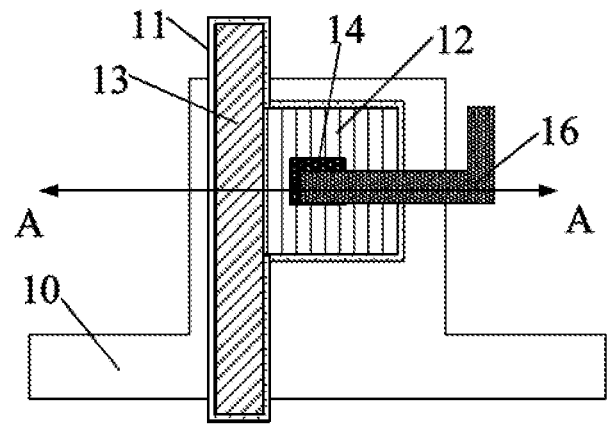
Figure 11C:
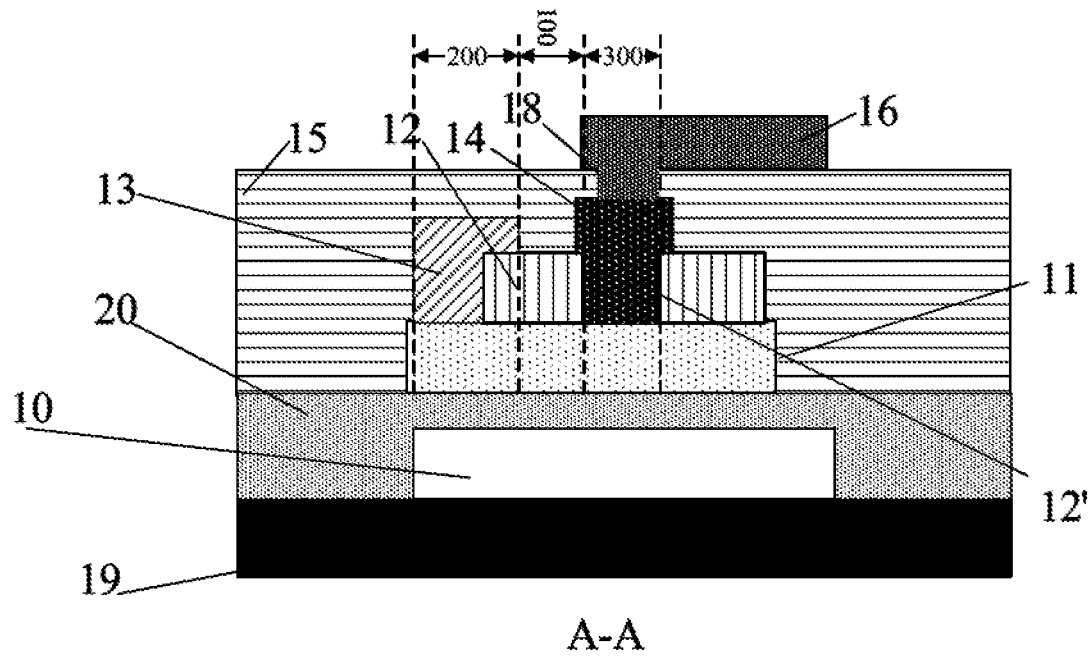

FIG. 11A to 11C illustrate a process of fabricating an array substrate in some embodiments according to the present disclosure. Referring to FIG. 11A and FIG. 11C, the source electrode 13 in some embodiments is formed to have a substantially L shape. The pixel electrode layer 16 is then formed on a side of the passivation layer 15 distal to the active layer 11. The first terminal of the pixel electrode layer 16 is electrically connected to the drain electrode 14 through the third via 18. The second terminal of the pixel electrode layer 16 is extends away from the drain electrode 14 through the opening in the L-shaped source electrode 13. Referring to FIG. 11B and FIG. 11C, the source electrode 13 in some embodiments is formed to have a substantially I shape (or a bar shape).

Similarly, the present disclosure provides a method of fabricating an array substrate having a top-gate thin film transistor. Specifically, the method in some embodiments includes forming a top-gate thin film transistor as described herein (e.g., the top-gate thin film transistor depicted in FIG. 2G and FIG. 2H). In some embodiments, the method further includes forming a passivation layer on a side of the gate electrode distal to the gate insulating layer, forming a third via extending through the passivation layer and the gate insulating layer, and forming a pixel electrode layer on a side of the passivation layer distal to the gate electrode. Optionally, the pixel electrode layer is formed to extend through the third via and is electrically connected to the drain electrode through the third via. Optionally, the pixel electrode layer is formed so that an orthographic projection of the pixel electrode layer on the base substrate is substantially non-overlapping with an orthographic projection of the source electrode on the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor, comprising:
a base substrate;
an active layer;
an etch stop layer on a side of the active layer distal to the base substrate;
a source electrode and a drain electrode on a side of the etch stop layer distal to the active layer; and
a first via extending through the etch stop layer;
wherein the active layer comprises a channel region, a source electrode contact region, and a drain electrode contact region;
an orthographic projection of the etch stop layer on the base substrate surrounds an orthographic projection of the drain electrode contact region on the base substrate;
a periphery of the orthographic projection of the etch stop layer on the base substrate is only partially surrounded by an orthographic projection of the source electrode contact region on the base substrate;
the drain electrode is electrically connected to the drain electrode contact region through the first via;
an orthographic projection of the drain electrode on the base substrate completely covers an orthographic projection of the first via and an orthographic projection of the drain electrode contact region on the base substrate;
wherein the orthographic projection of the etch stop layer on the base substrate partially overlaps with the orthographic projection of the drain electrode on the base substrate resulting in an overlapping area;
an outer portion of the orthographic projection of the etch stop layer on the base substrate completely surrounds the orthographic projection of the drain electrode on the base substrate;
the overlapping area completely surrounds the orthographic projection of the first via and the orthographic projection of the drain electrode contact region on the base substrate; and
the orthographic projection of the drain electrode on the base substrate is non-overlapping with an orthographic projection of the source electrode on the base substrate.

2. The thin film transistor of claim 1, wherein the overlapping area has a complete ring shape.

3. The thin film transistor of claim 2, wherein the etch stop layer has a complete ring shape.

4. The thin film transistor of claim 2, further comprising a gate electrode and a second via extending through the gate electrode;
wherein an orthographic projection of the second via at least partially overlaps with the orthographic projection of the first via.

5. The thin film transistor of claim 4, wherein the orthographic projection of the second via substantially overlaps with the orthographic projection of the first via.

6. The thin film transistor of claim 4, wherein the thin film transistor is a bottom-gate type thin film transistor;
the thin film transistor further comprises a gate insulating layer on a side of the gate electrode distal to base substrate and proximal to the active layer; and
the gate insulating layer extends through the second via.

7. The thin film transistor of claim 1, wherein the source electrode contact region has a substantially U shape;
the source electrode comprises a first portion, a second portion, and a third portion connecting the first portion and the second portion;
the first portion, the second portion, and the third portion form a structure having a substantially U shape;
the periphery of the orthographic projection of the etch stop layer on the base substrate comprises a first part, a second part, a third part, and a fourth part;
an orthographic projection of the first portion on the base substrate overlaps with the first part;
an orthographic projection of the second portion on the base substrate overlaps with the second part;
an orthographic projection of the third portion on the base substrate overlaps with the third part; and
an orthographic projection of the source electrode on the base substrate is non-overlapping with the fourth part.

8. The thin film transistor of claim 1, wherein the source electrode contact region has a substantially L shape;
the source electrode comprises a first portion and a second portion connected to the first portion; and
the first portion and the second portion form a structure having a substantially L shape.

9. An array substrate, comprising a thin film transistor of claim 1.

10. The array substrate of claim 9, wherein the thin film transistor is a bottom-gate type thin film transistor;
the array substrate further comprises a passivation layer on a side of the source electrode and the drain electrode distal to the active layer;
a third via extending through the passivation layer; and
a pixel electrode layer on a side of the passivation layer distal to the active layer;
wherein the pixel electrode layer extends through the third via and is electrically connected to the drain electrode through the third via; and
an orthographic projection of the pixel electrode layer on the base substrate is substantially non-overlapping with an orthographic projection of the source electrode on the base substrate.

11. The array substrate of claim 9, further comprising a plurality of gate lines and a plurality of data lines;
wherein the source electrode comprising a first portion, a second portion, and a third portion connecting the first portion and the second portion;
the first portion, the second portion, and the third portion form a substantially U-shape structure;
the third portion extends along a direction substantially parallel to one of the plurality of gate lines;
the first portion and the second portion extend along a direction substantially parallel to one of the plurality of data lines;
the periphery of the orthographic projection of the etch stop layer on the base substrate comprises a first part, a second part, a third part, and a fourth part;
an orthographic projection of the first portion on the base substrate overlaps with the first part;
an orthographic projection of the second portion on the base substrate overlaps with the second part;
an orthographic projection of the third portion on the base substrate overlaps with the third part; and
an orthographic projection of the source electrode on the base substrate is non-overlapping with the fourth part.

12. The array substrate of claim 9, further comprising a plurality of gate lines and a plurality of data lines;
wherein the source electrode comprising a first portion and a second portion connected to the second portion;
the first portion and the second portion form a substantially L-shape structure;
the first portion extends along a direction substantially parallel to one of the plurality of data lines; and
the second portion extends along a direction substantially parallel to one of the plurality of gate lines.

13. A display apparatus, comprising a thin film transistor of claim 1.

14. A method of fabricating a thin film transistor, comprising:
   forming an active layer on a base substrate;
   forming an etch stop layer on a side of the active layer distal to the base substrate; and
   forming a first via extending through the etch stop layer;
   forming a source electrode and a drain electrode on a side of the etch stop layer distal to the active layer;
   wherein the active layer is formed to comprise a channel region, a source electrode contact region, and a drain electrode contact region;
   the etch stop layer is formed so that an orthographic projection of the etch stop layer on the base substrate surrounds an orthographic projection of the drain electrode contact region on the base substrate; and
   a periphery of the orthographic projection of the etch stop layer on the base substrate is only partially surrounded by an orthographic projection of the source electrode contact region on the base substrate;
   wherein the drain electrode is formed to be electrically connected to the drain electrode contact region through the first via; and
   an orthographic projection of the drain electrode on the base substrate completely covers an orthographic projection of the first via and an orthographic projection of the drain electrode contact region on the base substrate;
   wherein the etch stop layer and the drain electrode are formed so that the orthographic projection of the etch stop layer on the base substrate partially overlaps with the orthographic projection of the drain electrode on the base substrate resulting in an overlapping area, and an outer portion of the orthographic projection of the etch stop layer on the base substrate completely surrounds the orthographic projection of the drain electrode on the base substrate;
   the overlapping area completely surrounds the orthographic projection of the first via and the orthographic projection of the drain electrode contact region on the base substrate; and
   the orthographic projection of the drain electrode on the base substrate is non-overlapping with an orthographic projection of the source electrode on the base substrate.

15. The method of claim 14, wherein forming the active layer comprises:
   forming a semiconductor material layer; and
   subsequent to forming the source electrode, the drain electrode, and the etch stop layer, patterning the semiconductor material layer using the source electrode, the drain electrode, and the etch stop layer as a mask plate, thereby forming the active layer.

16. The method of claim 14,
   wherein the overlapping area has a complete ring shape.

17. The method of claim 16, wherein the etch stop layer has a complete ring shape.

* * * * *